(12) United States Patent
Taketani

(10) Patent No.: US 8,987,799 B2
(45) Date of Patent: Mar. 24, 2015

(54) SEMICONDUCTOR DEVICE AND METHOD OF FORMING THE SAME

(71) Applicant: PS4 Luxco S.a.r.l., Luxembourg (LU)

(72) Inventor: Hiroaki Taketani, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/453,832

(22) Filed: Aug. 7, 2014

(65) Prior Publication Data

US 2014/0346595 A1 Nov. 27, 2014

Related U.S. Application Data

(63) Continuation of application No. 13/397,029, filed on Feb. 15, 2012, now Pat. No. 8,829,583.

(30) Foreign Application Priority Data

Feb. 21, 2011 (JP) .................. 2011-034896

(51) Int. Cl.
*H01L 27/108* (2006.01)
*H01L 29/06* (2006.01)
*H01L 29/423* (2006.01)
*H01L 29/78* (2006.01)
*H01L 29/08* (2006.01)

(52) U.S. Cl.
CPC ........ *H01L 29/0653* (2013.01); *H01L 29/4236* (2013.01); *H01L 29/7827* (2013.01); *H01L 27/108* (2013.01); *H01L 29/086* (2013.01); *H01L 29/0878* (2013.01)
USPC ....................................... 257/296

(58) Field of Classification Search
USPC .......................................... 257/296, E27.085
See application file for complete search history.

(56) References Cited

U.S. PATENT DOCUMENTS

| 5,026,658 | A | 6/1991 | Fuse et al. | |
| 5,493,137 | A * | 2/1996 | Satoh et al. | 257/296 |
| 6,566,191 | B2 | 5/2003 | Hsu et al. | |
| 6,821,842 | B1 * | 11/2004 | Lee et al. | 438/243 |
| 7,465,637 | B2 | 12/2008 | Yamazaki | |
| 7,829,418 | B2 | 11/2010 | Ueda et al. | |
| 8,012,828 | B2 | 9/2011 | Min et al. | |

(Continued)

FOREIGN PATENT DOCUMENTS

| JP | H0766297 | 3/1995 |
| JP | 2007081095 | 3/2007 |

(Continued)

OTHER PUBLICATIONS

T. Schloesser et al., "A 6F2 Buried Wordline DRAM Cell for 40nm and Beyond", International Electron Devices Meeting, p. 809-812, 2008.

*Primary Examiner* — Thao P Le
(74) *Attorney, Agent, or Firm* — Young & Thompson

(57) ABSTRACT

A semiconductor device includes a semiconductor device may include, but is not limited to, a semiconductor substrate, an isolation electrode, a gate electrode, a gate insulating film, and a first insulating film. The semiconductor substrate has a first groove and a second groove. An isolation electrode is positioned in the first groove. The gate electrode is positioned in the second groove. The gate insulating film is adjacent to the gate electrode. The first insulating film is adjacent to the isolation electrode. The isolation electrode is greater in threshold voltage than the gate electrode.

12 Claims, 33 Drawing Sheets

(56) References Cited

U.S. PATENT DOCUMENTS

| | | | |
|---|---|---|---|
| 8,653,596 B2* | 2/2014 | Cheng et al. | 257/347 |
| 2001/0050388 A1* | 12/2001 | Hamamoto | 257/301 |
| 2010/0102371 A1 | 4/2010 | Yeom | |
| 2010/0320527 A1* | 12/2010 | Okamura et al. | 257/324 |
| 2011/0169066 A1 | 7/2011 | Moon et al. | |
| 2012/0086060 A1* | 4/2012 | Taniguchi | 257/296 |
| 2012/0273859 A1 | 11/2012 | Oyu et al. | |

FOREIGN PATENT DOCUMENTS

| | | |
|---|---|---|
| JP | 2007-158269 | 6/2007 |
| JP | 2007-180150 | 7/2007 |
| JP | 2008305961 | 12/2008 |
| JP | 2009164612 | 7/2009 |

\* cited by examiner

SEMICONDUCTOR DEVICE AND METHOD OF FORMING THE SAME

BACKGROUND OF THE INVENTION

1. Field of the Invention

The present invention generally relates to a semiconductor device and to a method for forming a semiconductor device.

Priority is claimed on Japanese Patent Application No. 2011-034896, filed Feb. 21, 2011 the content of which is incorporated herein by reference.

2. Description of the Related Art

Devices such as DRAMs (Dynamic Random Access Memory) in which high integration is required have necessitated miniaturization of pattern rules with miniaturization of transistors. The STI (Shallow Trench Isolation) structure is generally employed for electrically isolating adjacent transistors in a DRAM cell. However, the patterning process for forming the STI structure has been difficult with miniaturization of the transistors. Further, a deterioration of characteristics of the transistors due to the short channel effect and an increase of contact resistance due to a decrease of a contact hole diameter occur with miniaturization of transistors.

A buried gate transistor is proposed in order to suppress such a phenomenon and promote further miniaturization of the transistors. Japanese Unexamined Patent Application, First Publication, No. JP-A-2007-180150 and T. Schloesser, et al., International Electron Devices Meeting, p. 809-812, 2008 disclose a buried gate transistor to be used as, for example, a cell transistor of the DRAM since the buried gate transistor is suitable for high integration.

SUMMARY

In one embodiment, a semiconductor device may include, but is not limited to, a semiconductor substrate, an isolation electrode, a gate electrode, a gate insulating film, and a first insulating film. The semiconductor substrate has a first groove and a second groove. An isolation electrode is positioned in the first groove. The gate electrode is positioned in the second groove. The gate insulating film is adjacent to the gate electrode. The first insulating film is adjacent to the isolation electrode. The isolation electrode is greater in threshold voltage than the gate electrode.

In another embodiment, a semiconductor device may include, but is not limited to, a semiconductor substrate, an isolation electrode, a gate electrode, a gate insulating film, and a first insulating film. The semiconductor substrate has first and second grooves. The isolation electrode is positioned in the first groove. The gate electrode is positioned in the second groove. The gate insulating film is positioned between the semiconductor substrate and the gate electrode. The first insulating film extends at least beneath the isolation electrode. The first insulating film beneath the isolation electrode is thicker than the gate insulating film beneath the gate electrode.

In still another embodiment, a semiconductor device may include, but is not limited to, a semiconductor substrate, an isolation electrode, a gate electrode, a gate insulating film, and a first insulating film. The semiconductor substrate has first and second grooves. The semiconductor substrate includes a first portion underneath the first groove and a second portion underneath the second groove. The first portion is higher in impurity concentration than the second portion. The isolation electrode is positioned in the first groove. The gate electrode is positioned in the second groove. The gate insulating film is adjacent to the gate electrode. The first insulating film is adjacent to the isolation electrode.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 28A to 33, in order to facilitate the understanding of the present invention.

Figure 32A:
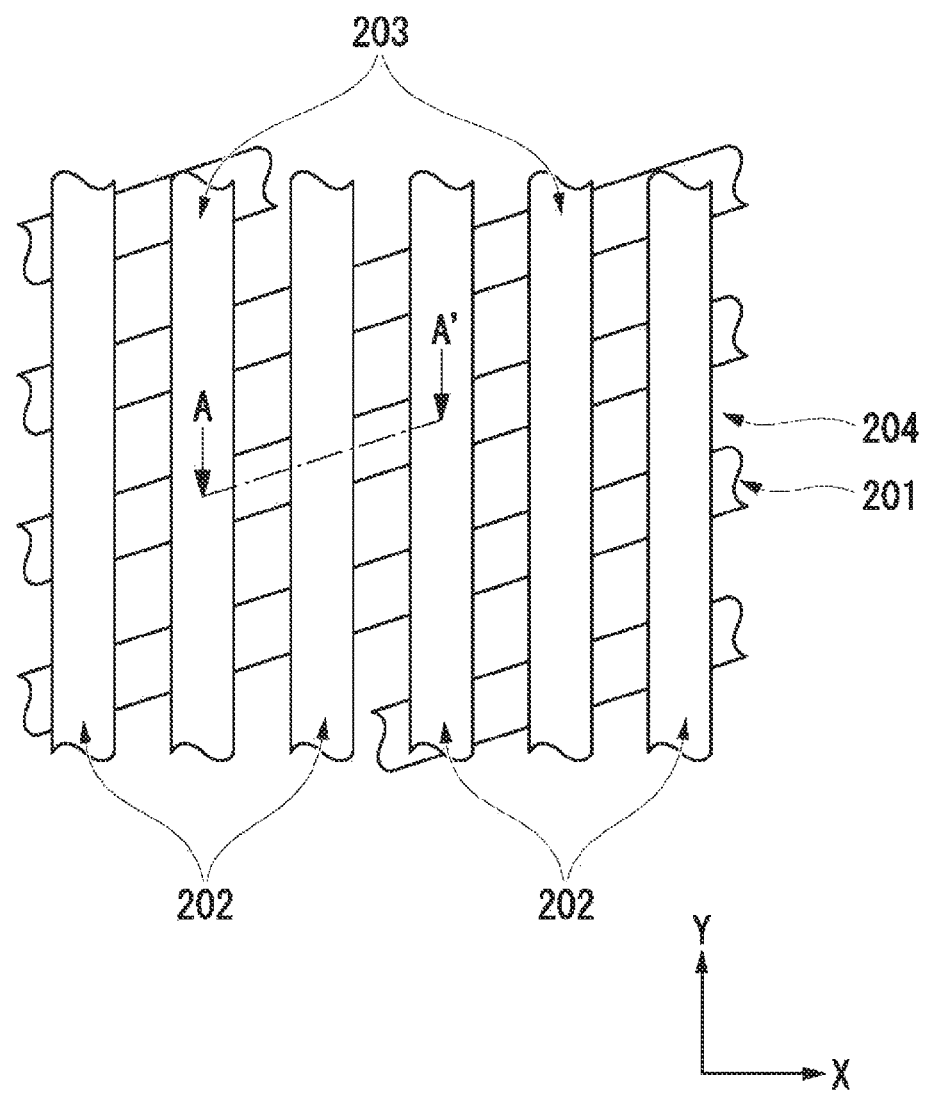
FIG. 32A is a fragmentary plan view illustrating a semiconductor device including a DRAM cell provided with a buried gate cell transistor in accordance with the related art.
Figure 32B:
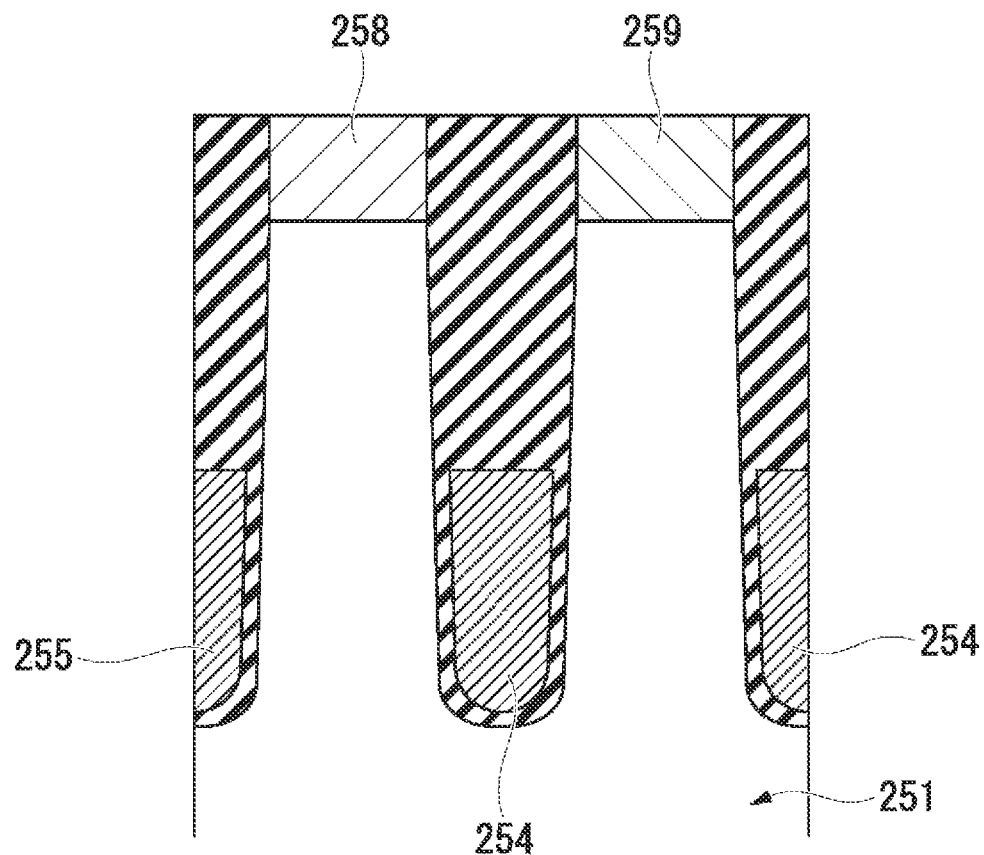
FIG. 32B is a fragmentary cross-sectional elevation view, taken along an A-A' line of FIG. 32A, illustrating the semiconductor device including the DRAM cell provided with the buried gate cell transistor in accordance with the related art.

A DRAM (semiconductor device) provided with a buried gate cell transistor having a structure in the related art will be explained with reference to FIGS. 32A and 32B. FIG. 32A is a fragmentary plan view illustrating a semiconductor device including a DRAM cell provided with a buried gate cell transistor in accordance with the related art. FIG. 32B is a fragmentary cross-sectional elevation view, taken along an A-A' line of FIG. 32A, illustrating the semiconductor device including the DRAM cell provided with the buried gate cell transistor in accordance with the related art.

As shown in FIG. 32A, the buried gate cell transistor with which the DRAM is provided is an n-type transistor. The buried gate cell transistor includes an active region 201, a buried gate electrode pattern 202, and a buried gate electrode pattern for isolation 203. The active region 201 is patterned in a line-shape. The buried gate electrode pattern 202 is formed to be in a line-shape. The STI structure is generally used for an isolation of the adjacent buried gate cell transistors. In the semiconductor device illustrated in FIG. 32A, an STI region 204 isolates elements adjacently provided in a Y-direction in FIG. 32A. The buried gate electrode pattern for isolation 203 electrically isolates elements adjacently provided in an X-direction in FIG. 32A.

Since the buried gate electrode pattern 202 and the buried gate electrode pattern for isolation 203 can be formed in the same steps, the known double patterning technique can be applied. The buried gate electrode pattern 202 and the buried gate electrode pattern for isolation 203 formed by the double patterning technique have a structure which is preferable for further miniaturization. Such a structure is known as a field shield structure.

As shown in FIG. 32B, a gate electrode 254 and a gate electrode for isolation 255 are buried in a p-type silicon substrate 251. Top surfaces of the gate electrode 254 and the gate electrode for isolation 255 are lower in level than a surface of the p-type silicon substrate 251. The gate electrode 254 is a lamination of a titanium nitride film and a tungsten film. The gate electrode for element isolation 255 isolates the adjacent buried gate cell transistors. Although specific illustrations in the drawings are omitted, a capacitor contact plug 258 is connected to a capacitor of the DRAM. A bit line contact plug 259 is connected to a bit line.

Although specific illustrations in the drawings are omitted, impurity diffusion regions are disposed on both sides of the gate electrode 254 and the gate electrode for element isolation 255. The impurity diffusion regions are respectively connected to the capacitor contact plug 258 and the bit line.

As described above, the cell transistor of the DRAM is demanded to be highly integrated. Also, current driving capacity sufficient to write and read the charge to/from a cell capacitor is demanded to be secured as with the high integration. A junction leakage current should be lowered in order to retain the charge written to the cell capacitor.

Figure 33:
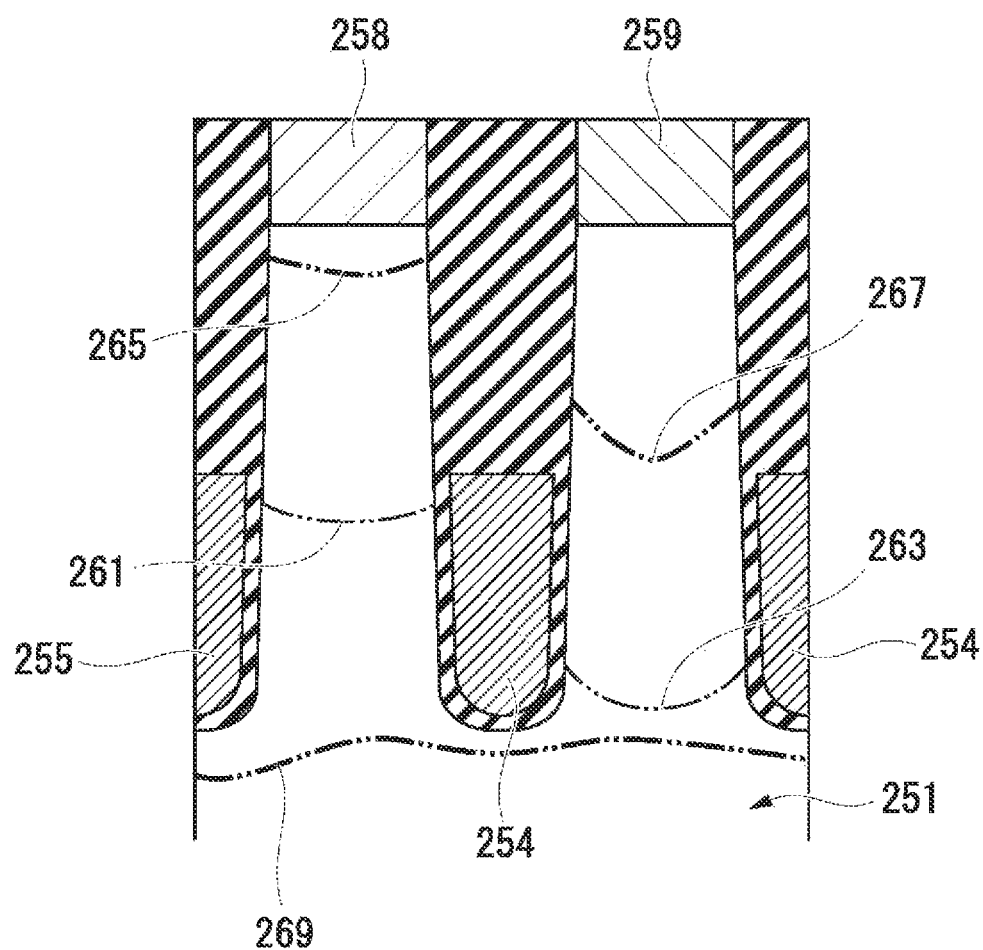
FIG. 33 is a fragmentary cross-sectional elevation view, taken along the A-A' line of FIG. 32A, illustrating the semiconductor device including the memory cell in a state where a transistor retains charge in accordance with the related art.

FIG. 33 is a fragmentary cross-sectional elevation view, taken along the A-A' line of FIG. 32A, illustrating the semiconductor device including the memory cell in a state where a transistor retains charge in accordance with the related art. As shown in FIG. 33, since the transistor retains the charge in the cell capacitor, a p/n junction on the cell capacitor side is depleted in a region from a top end of depletion layer on the capacitor side 265 to a bottom end of depletion layer 269. A p/n junction on the bit line side is depleted in a region from a top end of depletion layer on the bit line side 267 to the bottom end of depletion layer 269. Current generated in the depletion layer of the p/n junction on the cell capacitor side is a main component of the junction leakage current of the transistor. The junction leakage current is accelerated by TAT (Trap-Assisted Tunneling) generated by a junction field. Therefore, it is important for the cell transistor of the DRAM to make the junction field on the capacitor side low. An impurity concentration of the impurity diffusion region on the capacitor side is designed to be lower than that on the bit line side. The depth 261 of the p/n junction of the impurity diffusion region on the capacitor side is different from the depth 263 of the p/n junction of the impurity diffusion region on the bit line side.

Figure 34A:
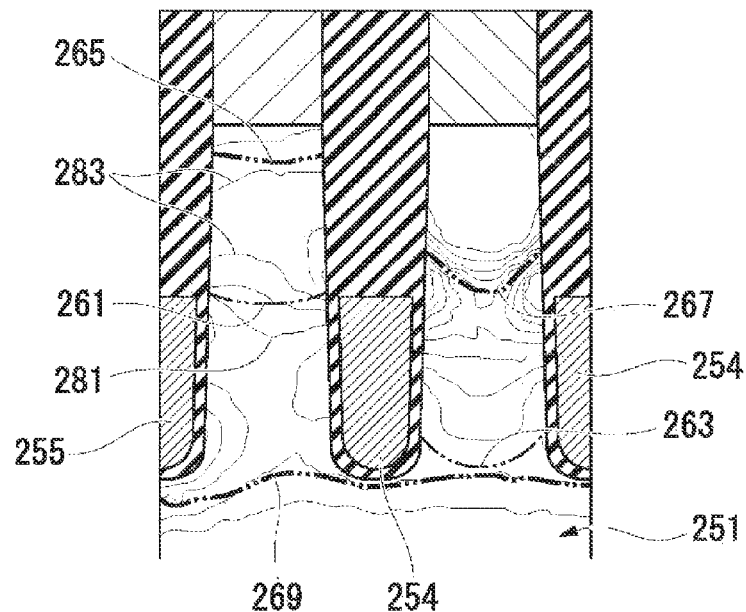
FIG. 34A is a fragmentary cross-sectional elevation view, taken along the A-A' line of FIG. 32A, illustrating an electric field distribution of the semiconductor device including the memory cell in a case where a gate electrode is deeply buried in accordance with the related art.
Figure 34B:
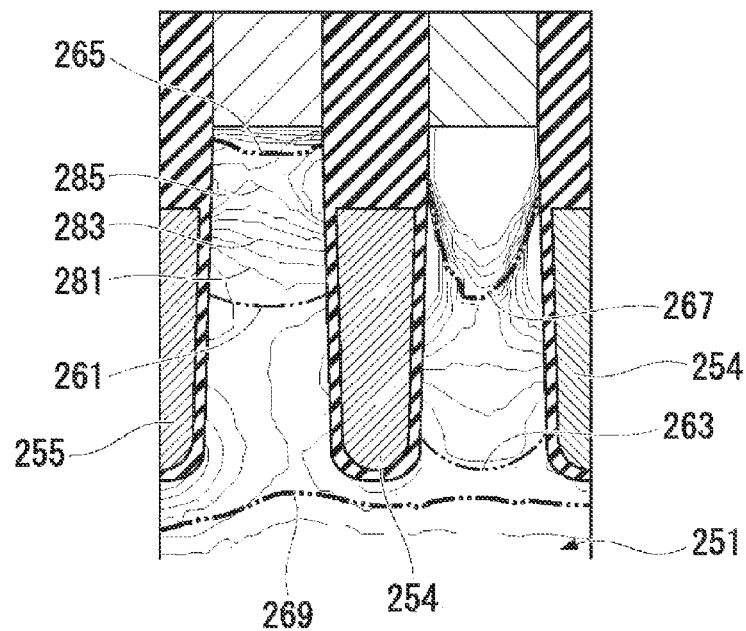
FIG. 34B is a fragmentary cross-sectional elevation view, taken along the A-A' line of FIG. 32A, illustrating the electric field distribution of the semiconductor device including the memory cell in a case where a gate electrode is shallowly buried in accordance with the related art.

An electric field distribution in the transistor in a state where the charge is retained in the cell capacitor will be schematically described with reference to FIGS. 34A and 34B. FIG. 34A is a fragmentary cross-sectional elevation view, taken along the A-A' line of FIG. 32A, illustrating the electric field distribution of the semiconductor device including the memory cell in a case where a gate electrode is deeply buried in accordance with the related art. FIG. 34B is a fragmentary cross-sectional elevation view, taken along the A-A' line of FIG. 32A, illustrating the electric field distribution of the semiconductor device including the memory cell in a case where a gate electrode is shallowly buried in accordance with the related art.

A profile of the impurity concentration of the semiconductor device illustrated in FIG. 34A is the same as that of the semiconductor device illustrated in FIG. 34B. As shown in FIG. 34B, when the gate electrode 254 and the gate electrode for element isolation 255 are buried shallowly, the electric field generated in the depletion layer of the p/n junction on the capacitor side becomes stronger and a slope of the electric field becomes steeper. Hence, the junction leakage current increases and a refresh property of the DRAM is deteriorated.

In the case where the buried gate transistor is applied to the cell transistor of the DRAM, the gate electrode 254 and the gate electrode for element isolation 255 should be designed so that the gate electrode 254 and the gate electrode for element isolation 255 are buried deeply enough to ease the junction field.

Figure 35:
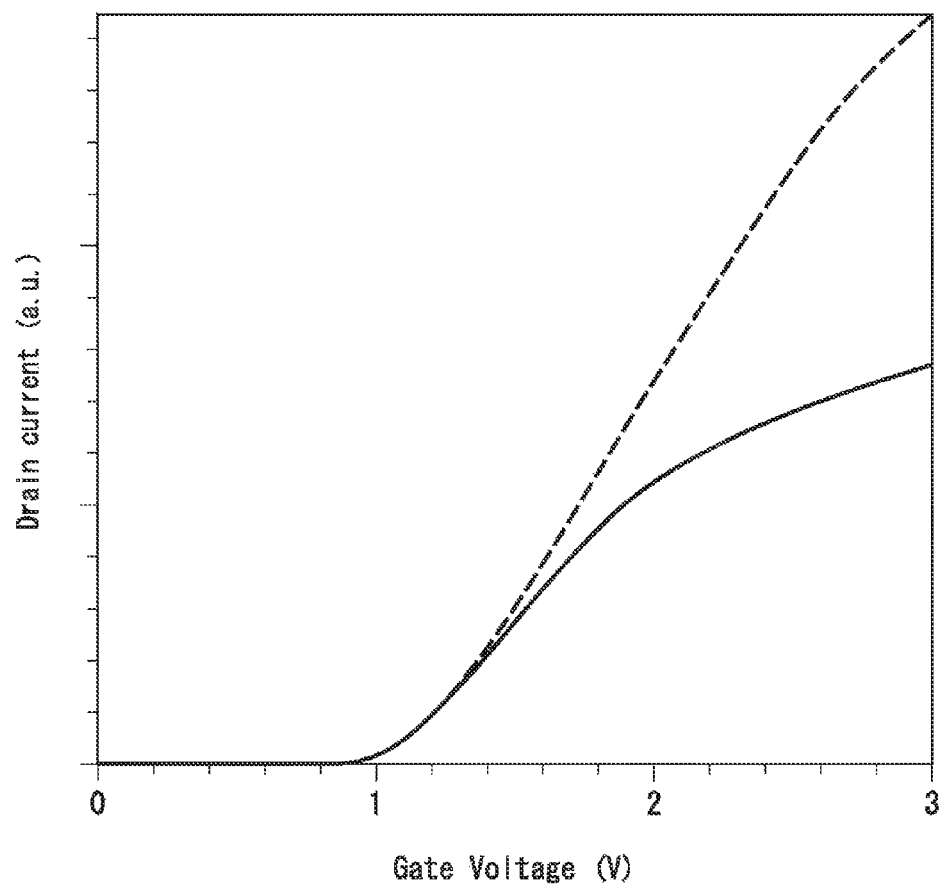
FIG. 35 is a graph showing a difference of a current driving capacity between the case where the gate electrode is deeply buried and the case where the gate electrode is shallowly buried in accordance with the related art.

As shown in FIG. 34A, in the case where the gate electrode 254 and the gate electrode for element isolation 255 are buried deeply, the junction leakage current can be suppressed. However, the impurity diffusion region on the capacitor side is too far from the gate electrode 254. Thereby, resistance of the impurity diffusion region on the capacitor side whose concentration is designed to be low is increased. Therefore, as shown in FIG. 35, in the case where the gate electrode is buried deeply (solid line) as shown in FIG. 34A, a current driving property is reduced compared to the case where the gate electrode is buried shallowly (broken line) as shown in FIG. 34B.

As described above, although the field shield structure is preferable for further miniaturization, the following phenomenon may occur compared to the case where the STI structure is employed for isolation.

Figure 36A:
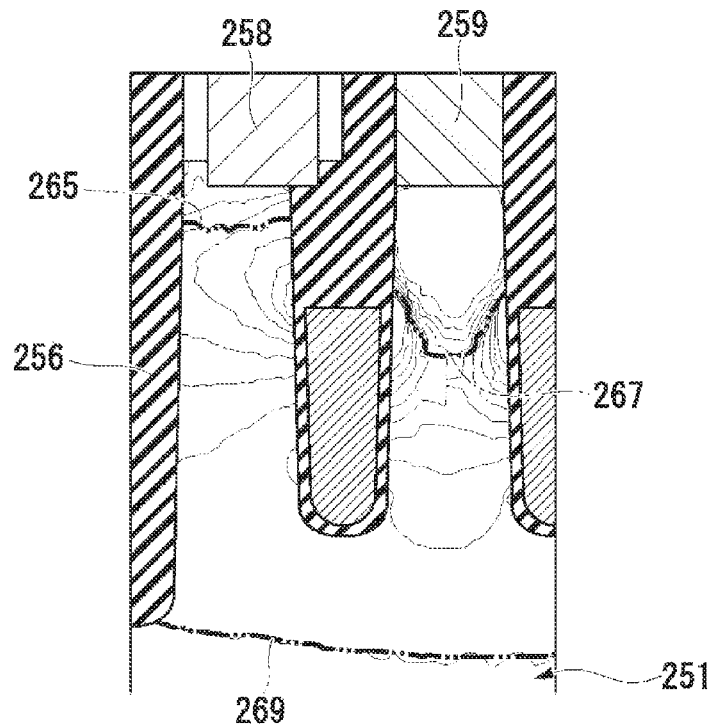
FIG. 36A is a fragmentary cross-sectional elevation view illustrating electric field distribution of a semiconductor device in which elements are isolated using a STI structure in a state where a transistor retains charge in accordance with the related art.
Figure 36B:
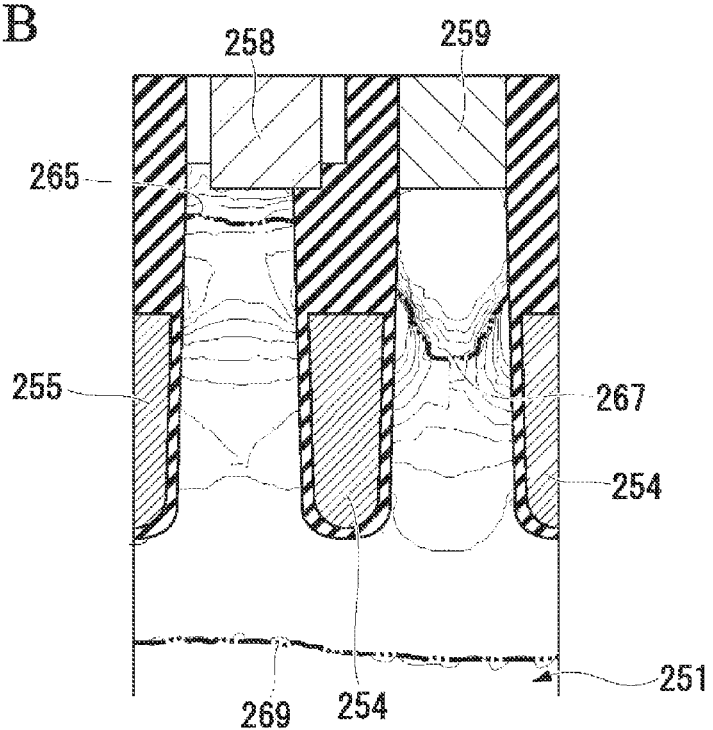
FIG. 36B is a fragmentary cross-sectional elevation view illustrating electric field distribution of a semiconductor device in which elements are isolated by a gate electrode in a state where a transistor retains charge in accordance with the related art.

With reference to FIGS. 36A and 36B, the electric field distribution in the transistor in a charge retaining state will be schematically described in the following two cases. One is the case where an STI 256 isolates elements, and the other is the case where the gate electrode for element isolation 255 isolates elements. FIG. 36A illustrates the electric field distribution in the transistor in the case where the STI 256 isolates the elements. FIG. 36B illustrates the electric field distribution in the transistor in the case where the gate electrode for element isolation 255 isolates the elements.

In the DRAM which has the field shield structure as shown in FIG. 36B, a sufficiently lower voltage than a threshold voltage, generally a negative voltage, should be applied to the gate electrode for element isolation 255 in order to electrically isolate the adjacent transistors. When such a voltage is applied, compared to the case where the STI 256 isolates the elements as shown in FIG. 36A, the junction field becomes stronger in the impurity diffusion region connected to a capacitor contact plug 258, which causes an increase of the junction leakage current. Because of the increase of the junction leakage current, the refresh property of the DRAM is deteriorated.

Figure 37:
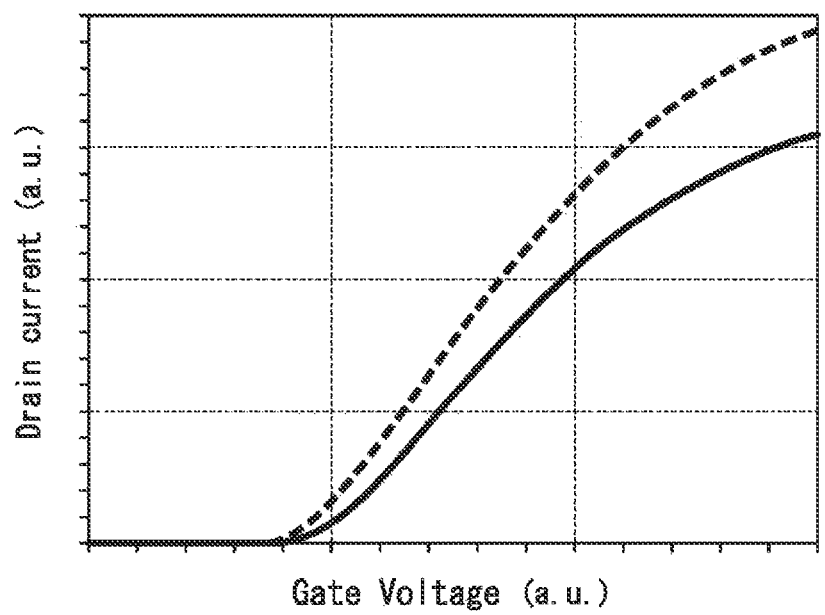
FIG. 37 is a graph showing a difference of a current driving capacity between the case where the elements are isolated using the STI structure and the case where the elements are isolated using the gate electrode.

The electron density is decreased in silicon in the vicinity of the gate electrode for element isolation 255 applied with such a voltage. Therefore, as shown in FIG. 37, compared to the case where the STI 256 isolates the elements (broken line), on-current of the transistor, which is drain current, is decreased in the case where the gate electrode for element isolation 255 isolates the elements (solid line).

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate, an isolation electrode, a gate electrode, a gate insulating film, and a first insulating film. The semiconductor substrate has a first groove and a second groove. An isolation electrode is positioned in the first groove. The gate electrode is positioned in the second groove. The gate insulating film is adjacent to the gate electrode. The first insulating film is adjacent to the isolation electrode. The isolation electrode is greater in threshold voltage than the gate electrode.

In some cases, the semiconductor device may include, but is not limited to, the first insulating film underneath the isolation electrode being thicker than the gate insulating film underneath the gate electrode.

In some cases, the semiconductor device may include, but is not limited to, a bottom of the first insulating film being lower in level than a bottom of the gate insulating film.

In some cases, the semiconductor device may include, but is not limited to, the first insulating film including a bottom portion and side portions. The bottom portion is positioned underneath the bottom of the isolation electrode. The side portions are positioned adjacent to side surfaces of the isolation electrode. The bottom portion of the first insulating film is thicker than the side portions of the first insulating film.

In some cases, the semiconductor device may include, but is not limited to, the first insulating layer of which the bottom portion has a multi-layered structure.

In some cases, the semiconductor device may include, but is not limited to, the isolation electrode of which a bottom is substantially the same in level as a bottom of the gate electrode.

In some cases, the semiconductor device may further include, but is not limited to, a first diffusion region underneath the first groove. The first diffusion region has the same conductivity type as the semiconductor substrate. The first diffusion region is greater in impurity concentration than other portion of the semiconductor substrate.

In some cases, the semiconductor device may include, but is not limited to, the gate insulating film and the first insulating films which are substantially the same in thickness as each other.

In some cases, the semiconductor device may further include, but is not limited to, a second diffusion region underneath the second groove. The second diffusion region has the same conductivity type as the semiconductor substrate. The second diffusion region is lower in impurity concentration than other portion of the semiconductor substrate.

In some cases, the semiconductor device may include, but is not limited to, the gate insulating film and the first insulating films which are substantially the same in thickness as each other.

In some cases, the semiconductor device may include, but is not limited to, the semiconductor substrate including a first portion underneath the first groove and a second portion underneath the second groove. The first portion is higher in impurity concentration than the second portion.

In some cases, the semiconductor device may include, but is not limited to, the gate insulating film and the first insulating films which are substantially the same in thickness as each other.

In some cases, the semiconductor device may further include, but is not limited to, a third diffusion region in the semiconductor substrate. The third diffusion region is positioned between the first and second grooves.

In some cases, the semiconductor device may further include, but is not limited to, a fourth diffusion region adjacent to the second groove. The second groove is positioned between the third and fourth diffusion regions. The fourth diffusion region is greater in impurity concentration than the third diffusion region. The fourth diffusion region is deeper in bottom level than the third diffusion region.

In some cases, the semiconductor device may include, but is not limited to, the fourth diffusion region being shallower in bottom level than the second groove.

In some cases, the semiconductor device may further include, but is not limited to, a bit line coupled to the fourth diffusion region and a capacitor coupled to the third diffusion region.

In another embodiment, a semiconductor device may include, but is not limited to, a semiconductor substrate, an isolation electrode, a gate electrode, a gate insulating film, and a first insulating film. The semiconductor substrate has first and second grooves. The isolation electrode is positioned in the first groove. The gate electrode is positioned in the second groove. The gate insulating film is positioned between the semiconductor substrate and the gate electrode. The first insulating film extends at least beneath the isolation electrode. The first insulating film beneath the isolation electrode is thicker than the gate insulating film beneath the gate electrode.

In some cases, the semiconductor device may further include, but is not limited to, a third diffusion region, a fourth diffusion region, a bit line, and a capacitor. The third diffusion region is positioned in the semiconductor substrate. The third diffusion region is positioned between the first and second grooves. The fourth diffusion region is adjacent to the second groove. The second groove is positioned between the third and fourth diffusion regions. The fourth diffusion region is greater in impurity concentration than the third diffusion region. The fourth diffusion region is deeper in bottom level than the third diffusion region. The fourth diffusion region is shallower in bottom level than the second groove. The bit line is coupled to the fourth diffusion region. The capacitor is coupled to the third diffusion region.

In still another embodiment, a semiconductor device may include, but is not limited to, a semiconductor substrate, an isolation electrode, a gate electrode, a gate insulating film, and a first insulating film. The semiconductor substrate has first and second grooves. The semiconductor substrate includes a first portion underneath the first groove and a second portion underneath the second groove. The first portion is higher in impurity concentration than the second portion. The isolation electrode is positioned in the first groove. The gate electrode is positioned in the second groove. The gate insulating film is adjacent to the gate electrode. The first insulating film is adjacent to the isolation electrode.

In some cases, the semiconductor device may further include, but is not limited to, a third diffusion region, a fourth diffusion region, bit line and a capacitor. The third diffusion region is positioned in the semiconductor substrate. The third diffusion region is positioned between the first and second grooves. The fourth diffusion region is adjacent to the second groove. The second groove is positioned between the third and fourth diffusion regions. The fourth diffusion region is greater in impurity concentration than the third diffusion region. The fourth diffusion region is deeper in bottom level than the third diffusion region. The fourth diffusion region is shallower in bottom level than the second groove. The bit line is coupled to the fourth diffusion region. The capacitor is coupled to the third diffusion region.

In yet another embodiment, a method of forming a semiconductor device may include, but is not limited to, the following processes. First grooves are formed in a semiconductor substrate. An insulator is filled in the first grooves. Second grooves are formed in the semiconductor substrate while forming third grooves by removing part of the insulator. The second grooves are shallower than the first grooves. The second grooves are positioned between the first grooves. Insulating films are formed on inner surfaces of the second and third grooves. A conductor is formed in the second and third grooves. The conductor is etched back to form gate electrodes in the second grooves and isolation electrodes in the third grooves.

In some cases, the method may further include, but is not limited to, forming a conductive films over the gate electrodes and the isolation electrodes.

In some cases, forming the insulating films may include, but is not limited to, performing a thermal oxidation of the inner surface of the first and third grooves.

In some cases, the method may further include, but is not limited to, introducing an impurity into the semiconductor substrate after forming the first grooves.

In some cases, the method may further include, but is not limited to, implanting the impurity into the semiconductor substrate in a region between the gate electrodes after etching back the conductor.

Hereinafter, a semiconductor device and a method for forming the same according to an embodiment of the invention will be described in detail with reference to the drawings. As an example of the semiconductor device, a DRAM provided with the memory cell transistor which is an n-type MOS-FET will be explained. For convenience, in assisting understanding of the features thereof the drawings used in the following descriptions sometimes show enlarged features, and the dimensional ratios and the like of constituent elements are not necessarily the same as a real semiconductor device. Also, the raw materials and dimensions and the like given as examples in the following descriptions are only examples, and the present invention is not restricted thereto, it being possible to embody arbitrarily variations within a scope that does not change the essence thereof.

First Embodiment

Figure 1A:
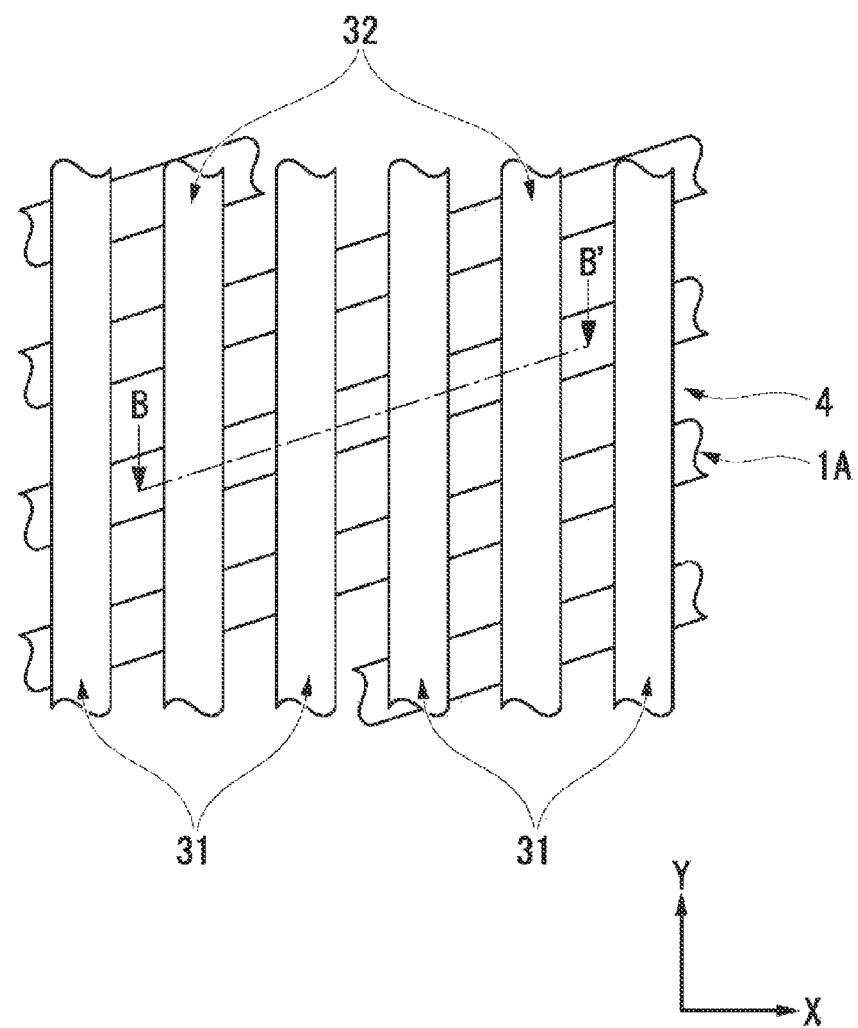
FIG. 1A is a fragmentary plan view illustrating a semiconductor device including a memory cell in accordance with a first preferred embodiment of the present invention.
Figure 1B:
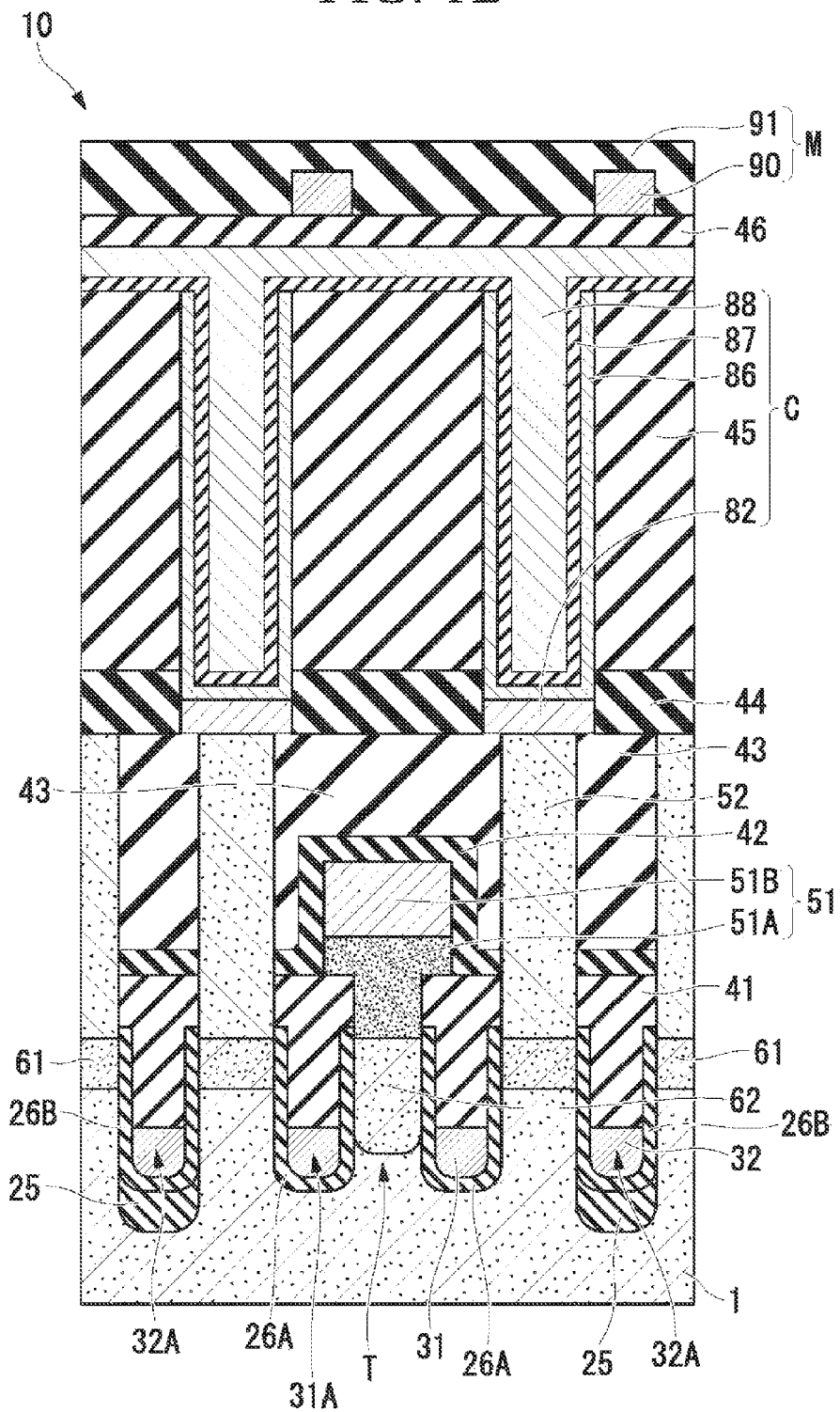
FIG. 1B is a fragmentary cross-sectional elevation view, taken along a B-B' line of FIG. 1A, illustrating the semiconductor device including the memory cell in accordance with the first preferred embodiment of the present invention.

As shown in FIGS. 1A and 1B, a structure of a DRAM 10 which is obtained by applying a semiconductor device of the first embodiment will be explained. FIG. 1A is a fragmentary plan view illustrating a semiconductor device including a memory cell in accordance with a first preferred embodiment of the present invention. FIG. 1B is a fragmentary cross-sectional elevation view, taken along a B-B' line of FIG. 1A, illustrating the semiconductor device including the memory cell in accordance with the first preferred embodiment of the present invention. In order to easily recognize parts of the semiconductor device, some elements are omitted in FIGS. 1A and 1B.

According to the present embodiment, the semiconductor device may include, but is not limited to, a plurality of active regions 1A, isolation regions 4, first isolation trenches 32A, gate trenches 31A, an insulating film 25, a gate insulating film 26A, impurity diffusion regions 61, an impurity diffusion region 62, an isolation electrode 32, and a gate electrode 31. The plurality of active regions 1A extending in a line-shape are formed in a semiconductor substrate 1. The isolation regions 4 having a STI structure define the active regions 1A. The first isolation trenches 32A are formed in the semiconductor substrate 1 so as to cross the active regions 1A. The first isolation trenches 32A define a plurality of element regions in the active region 1A. The gate trench 31A is disposed between the adjacent first isolation trenches 32A. The gate trench 31A is shallower than the first isolation trench 32A. The insulating film 25 is disposed in the first isolation trench 32A. The gate insulating film 26A is disposed in the gate trench 31A. The impurity diffusion regions 61 are formed in the active region 1A positioned on both sides of the first isolation trenches 32A. The impurity diffusion region 62 is formed in the active region 1A between the gate trenches 31A. The isolation electrode 32 is buried in the first isolation trench 32A. The insulating film 25 is interposed between the isolation electrode 32 and a surface of the first isolation trench 32A. The gate electrode 31 is buried in the gate trench 31A. The gate insulating film 26A is interposed between the gate electrode 31 and a surface of gate trench 31A. The insulating film 25 positioned below the isolation electrode 32 is thicker than the gate insulating film 26A positioned below the gate electrode 31.

A memory cell of the DRAM 10 to which the semiconductor device according to the present embodiment is applied has a lamination structure which may include, but is not limited to, a buried gate transistor T, a capacitor C, and a wiring layer M. The buried gate transistor T includes the gate electrode 31 which is buried in the semiconductor substrate 1.

The DRAM 10 according to the present embodiment has an arrangement of 6F$^2$ cells (where F is the minimum process dimension) as shown in FIG. 1B.

As shown in FIG. 1A, a plurality of buried insulators which are the isolation regions 4 are provided in the memory cell region of the DRAM 10 and over the plate semiconductor substrate (not shown) so as to have a predetermined angle with respect to the X-direction in FIG. 1A and to be formed in a line-shape. The active region 1A is defined in a line-shape by the plurality of isolation regions 4 which are formed in a line-shape. According to the present embodiment, a p-type single crystal silicon substrate may be used as the semiconductor substrate.

The isolation electrodes 32 are disposed so as to cross the active region 1A and extend in a line-shape in order to define the plurality of element regions in the active region 1A. A distance between the adjacent isolation electrodes 32 is set so as to be a predetermined interval.

The gate electrode 31 which functions as a word line is disposed between the adjacent isolation electrodes 32. The gate electrode 31 extends in parallel to the isolation electrode 32. The gate electrode 31 and the isolation electrode 32 are periodically arranged in the X-direction. As shown in FIG. 1A, according to the present embodiment, two gate electrodes 31 are arranged between the adjacent isolation electrodes 32 at equal intervals.

Although not shown in FIG. 1A, a plurality of bit lines 51 illustrated in FIG. 1B are arranged in a direction perpendicular to the gate electrode 31, which is the X-direction in FIG. 1A, at predetermined intervals. Thereby, each of memory cells is arranged at regions where the gate electrodes 31 cross the active regions 1A.

Elements in the vicinity of the memory cell disposed in the region where the gate electrode 31 crosses the active region 1A will be explained in detail.

First, the buried gate transistor T included in the memory cell will be described.

As shown in FIG. 1B, the first isolation trenches 32A are formed in the active region of the semiconductor substrate. The gate trenches 31A for forming the gate electrodes 31 are disposed between the adjacent first isolation trenches 32A. The bottom of the gate trench 31A is higher in level than that of the first isolation trench 32A. The gate trenches 31A are arranged between the adjacent first isolation trenches 32A at the predetermined interval.

The insulating film 25 which includes silicon oxide is disposed below the first isolation trench 32A. A thermal oxidation film 26B which includes silicon oxide in the same manner as the insulating film 25 is disposed on a side surface of the first isolation trench 32A.

The gate insulating film 26A which includes silicon oxide in the same manner as the insulating film 25 is disposed on an inner surface of the gate trench 31A.

The isolation electrode 32 is disposed in the first isolation trench 32A. The gate electrode 31 is disposed in the gate trench 31A. The material of the isolation electrode 32 and the gate electrode 31 is not limited. The isolation electrode 32 and the gate electrode 31 may be formed by lamination of a titanium nitride film and a tungsten film.

The top and bottom surfaces of the isolation electrode 32 are substantially the same as those of the gate electrode 31. The isolation electrode 32 and the gate electrode 31 include the same material and have the same structure. The isolation electrode 32 electrically isolates the adjacent transistors and does not function as a gate electrode of the transistor.

The insulating film 25 disposed below the isolation electrode 32 is thicker than the gate insulating film 26A disposed below the gate electrode 31. Since the bottom surface of the isolation electrode 32 is substantially the same as that of the gate electrode 31 as described above, the insulating film 25 is thicker than the gate insulating film 26A by a difference between the depth of the first isolation trench 32A and that of the gate trench 31A.

A first interlayer insulating film 41 is disposed over the isolation electrode 32 and the gate electrode 31. The first interlayer insulating film 41 covers the semiconductor substrate 1. At least part of the first interlayer insulating film 41 is buried in the first isolation trench 32A and the gate trench 31A. The first interlayer insulating film 41 may include, but is not limited to, silicon oxide. The first interlayer insulating film 41 protects the top surfaces of the isolation electrode 32 and the gate electrode 31.

The impurity diffusion regions 61 are disposed in the active regions 1A on both sides of the first isolation trench 32A. The impurity diffusion region 62 is disposed in the active region 1A between the gate trenches 31A. An impurity ion which has a different conductivity type from an impurity ion in the active region 1A is implanted into the impurity diffusion regions 61 and 62.

The depth of the impurity diffusion region 62 disposed between the gate trenches 31A is greater than that of the impurity diffusion region 61 disposed on both sides of the first isolation trench 32A. Since a concentration of the impurity ion in the impurity diffusion region 62 is adjusted to be higher than that of the impurity ion in the impurity diffusion region 61, the depth of the impurity diffusion region 61 is different from that of the impurity diffusion region 62. In order to make the junction field in the vicinity of the isolation electrode 32 low and suppress an increase of the junction leakage current, the concentration of the impurity diffusion region 61 is set to be low. The bottoms of the impurity diffusion regions 61 disposed on both sides of the gate trench 31A are separated from the top surface of the isolation electrode 32.

Hereinafter, the impurity diffusion region 62 disposed between the gate trenches 31A is referred to as a high concentration impurity diffusion region. The impurity diffusion regions 61 disposed on the both sides of the first isolation trench 32A are referred to as low concentration impurity diffusion regions. The impurity diffusion region 61 is distinguished from the impurity diffusion region 62.

The bit line 51 is disposed over the high concentration impurity diffusion region. The bit line 51 may include, but is not limited to, a polysilicon 51A into which an impurity ion having a different conductivity type from the conductivity type of the active region 1A is implanted and a lamination 51B including a tungsten nitride film, and a tungsten film.

The low concentration impurity diffusion region 61 is connected to the capacitor C, which will be described later, via a capacitor contact plug 52. The capacitor contact plug 52 may be, but is not limited to, polysilicon into which an impurity ion having a different conductivity type from the conductivity type of the active region 1A.

According to the present embodiment, the concentration of the impurity ion implanted into the capacitor contact plug 52 is adjusted to be higher than the concentration of the impurity ion of the low concentration impurity diffusion region 61.

A second interlayer insulating film 42 covers the top surface of the first interlayer insulating film 41 and the bit line 51. The second interlayer insulating film 42 may be, but is not limited to, a silicon nitride film. A third interlayer insulating film 43 is disposed over the second interlayer insulating film 42. A top surface of third interlayer insulating film 43 is substantially flush with a top surface of the capacitor contact plug 52. The third interlayer insulating film 43 may include, but is not limited to, silicon oxide.

The capacitor C will be described.

According to the present embodiment, the plurality of memory cells is formed in the whole memory cell region. Each of the memory cells is provided with the capacitor C as shown in FIG. 1B.

The capacitor C is connected to the low concentration impurity diffusion region 61 of the buried gate transistor T via the capacitor contact plug 52 as described above.

A capacitor contact pad 82 is connected to the capacitor C. The capacitor contact pad 82 is disposed over the capacitor contact plug 52. The capacitor contact pads 82 are arranged in the memory cell region at predetermined intervals so as not to overlap with each other.

A fourth interlayer insulating film 44 is disposed over the capacitor contact plug 52 and the third interlayer insulating film 43. The fourth interlayer insulating film 44 surrounds the capacitor contact pad 82.

A fifth interlayer insulating film 45 is disposed over the fourth interlayer insulating film 44. A first electrode 86 and a second electrode 88 penetrate the fourth interlayer insulating film 44 and the fifth interlayer insulating film 45 and are disposed over the capacitor contact pad 82. A capacitor insulating film 87 is disposed between the first electrode 86 and the second electrode 88.

The capacitor C has a configuration described above.

According to the present embodiment, the cylindrical capacitor which uses only the inner wall of the first electrode 86 as an electrode is described as one example. However, the present embodiment is not limited thereto. For example, a crown capacitor which uses the inner wall and the outer wall of the first electrode 86 may be used.

The wiring layer M is disposed over the capacitor C while a sixth interlayer insulating film 46 is interposed between the wiring layer M and the capacitor C. The wiring layer M includes an upper metal wiring 90 and a wiring protection film 91. According to the present embodiment, the wiring layer M has a one-layer wiring structure as one example, but is not limited thereto. For example, the wiring layer M may have a multi-layer wiring structure which includes a plurality of wiring layers and interlayer insulating films.

The method for forming the DRAM (semiconductor device) 10 according to the present embodiment will be described with reference to FIGS. 2 to 22. FIGS. 2 to 22 are fragmentary cross-sectional elevation views, taken along the B-B' line of FIG. 1A, illustrating the semiconductor device in steps involved in a method of forming the semiconductor device of FIG. 1A in accordance with the first preferred embodiment of the present invention.

Through these processes, the semiconductor device illustrated in FIGS. 1A and 1B is formed.

The method for forming the DRAM 10 according to the present embodiment may include, but is not limited to, first to fifth processes. In the first process, the active region 1A is defined in a line-shape by burying a buried insulator in the semiconductor substrate 1 to form the isolation region 4, and the active region 1A is defined as a plurality of element regions by forming the first isolation trenches 32A in the active region 1A. In the second process, the insulating film 25 is formed in the first isolation trenches 32A. In the third process, the impurity diffusion regions 61 and 62 are formed in the active region 1A. In the fourth process, two gate trenches 31A which are shallower than the first isolation trenches 32A are formed between the adjacent first isolation trenches 32A while the second isolation trenches 32B are formed by removing part of the insulating film 25 so that the insulating film 25 remains at the bottom of the first isolation trench 32A. In the fifth process, the thermal oxidation films 26A and 26B are formed on the inner surfaces of the gate trench 31A and the second isolation trench 32B, respectively, and then the gate electrode 31 and the isolation electrode 32 are formed in the gate trench 31A and the second isolation trench 32B, respectively.

Hereinafter, each process will be described in detail.

The first process will be explained.

As shown in FIG. 1A, the isolation region 4 for isolating the active regions 1A is formed by a known method on the surface of the semiconductor substrate which includes silicon.

Although the detailed illustrations are omitted in the drawings, in the formation of the isolation region 4, for example, a silicon oxide film and a silicon nitride film which will be used as a mask are sequentially deposited on a p-type single crystal silicon substrate (the semiconductor substrate 1). The silicon nitride film which will be used as the mask is deposited so as to be in a line-shape.

The silicon oxide film, the silicon nitride film, and the semiconductor substrate 1 are sequentially patterned by a photolithography process and dry etching process. Thereby, the isolation groove for isolating the active regions 1A is formed on the semiconductor substrate 1. Since the silicon nitride film is formed in a line-shape, the isolation groove also has line-shape. The surface of the silicon substrate which is the active region 1A is covered by the silicon nitride film used as the mask.

The buried insulator is buried in the isolation groove having the STI structure. The buried insulator may be, but is not limited to, an oxide film formed by HDP-CVD (High-Density Plasma Chemical Vapor Deposition) or an applied film such as SOD (Spin On Dielectric). The silicon nitride film used as the mask and the silicon oxide film are removed by wet etching process or the like.

In this way, the isolation region 4 having the STI structure is formed together with forming the active regions 1A defined in a line-shape by the isolation region 4.

Figure 2:
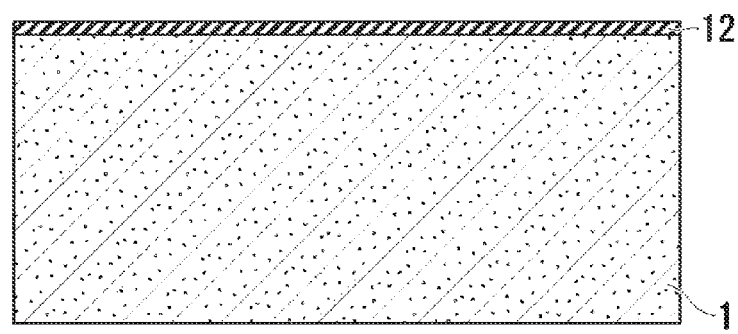
FIG. 2 is a fragmentary cross-sectional elevation view, taken along the B-B' line of FIG. 1A, illustrating the semiconductor device in a step involved in a method of forming the semiconductor device of FIG. 1A in accordance with the first preferred embodiment of the present invention.
Figure 3:
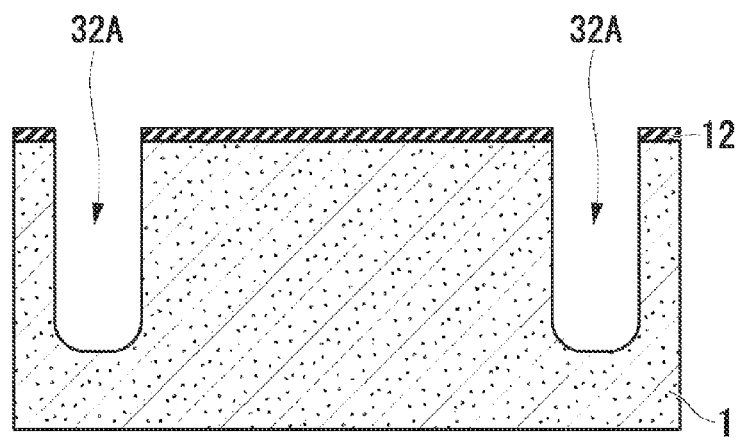
FIG. 3 is a fragmentary cross-sectional elevation view, taken along the B-B' line of FIG. 1A, illustrating the semiconductor device in a step, subsequent to FIG. 2, involved in the method of forming the semiconductor device of FIG. 1A in accordance with the first preferred embodiment of the present invention.

As shown in FIG. 2, a silicon oxide insulating film 12 is formed on the semiconductor substrate 1 by thermal oxidation. According to the present embodiment, the silicon oxide insulating film 12 with a thickness of approximately 10 nm is formed, but the thickness thereof is not limited thereto.

As shown in FIG. 3A, the first isolation trench 32A is formed by a lithography process and dry etching process. The depth of the first isolation trench 32A is set to be approximately 180 nm, for example. The first isolation trench 32A is formed to be a line-shape pattern so as to extend in a predetermined direction crossing the active region 1A, for example the Y-direction in FIG. 1A. By doing this, the active region 1A is defined as a plurality of elements (transistors).

The second process will be described.

Figure 4:
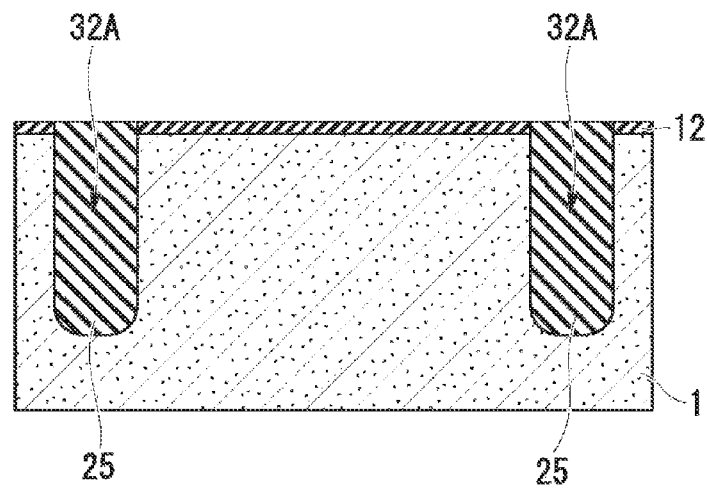
FIG. 4 is a fragmentary cross-sectional elevation view, taken along the B-B' line of FIG. 1A, illustrating the semiconductor device in a step, subsequent to FIG. 3, involved in the method of forming the semiconductor device of FIG. 1A in accordance with the first preferred embodiment of the present invention.

As shown in FIG. 4, the insulating film 25 is buried in the first isolation trench 32A. For example, the insulating film 25 is deposited in the first isolation trench 32A and the top surface of the semiconductor substrate 1. Then, the silicon oxide insulating film 12 is exposed by CMP (Chemical Mechanical Planarization). By doing this, the insulating film 25 remaining in the first isolation trench 32A is formed.

Similar to the isolation region 4, the insulating film 25 may be, but is not limited to, an oxide film formed by HDP-CVD or an applied film such as SOD.

The third process will be described.

Figure 5:
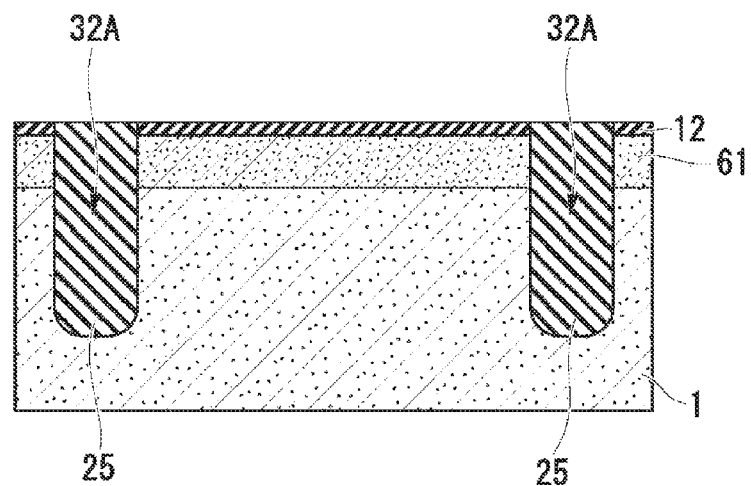
FIG. 5 is a fragmentary cross-sectional elevation view, taken along the B-B' line of FIG. 1A, illustrating the semiconductor device in a step, subsequent to FIG. 4, involved in the method of forming the semiconductor device of FIG. 1A in accordance with the first preferred embodiment of the present invention.

As shown in FIG. 5, the impurity diffusion region 61 is formed in a surface region of the semiconductor substrate 1 in the active region 1A by diffusing an impurity element having a conductivity type different from a conductivity type of the impurity element in the active region 1A. According to the present embodiment, since the p-type single crystal silicon substrate is used as the semiconductor substrate 1, an n-type impurity element such as phosphorus is used as the impurity element.

For example, as shown in FIG. 5, the n-type impurity element such as phosphorus is implanted into the semiconductor substrate 1 using the silicon oxide insulating film 12 as a mask with an acceleration energy of 20 keV and an ion implant dose of $1\times10^{13}$ atoms/cm$^2$. After that, a heat treatment is performed in a nitrogen atmosphere at 980° C. for 10 seconds. Thereby, the impurity diffusion region 61 in which the n-type impurity element is diffused is formed. The impurity diffusion region 61 functions as one of source and drain regions of the buried gate transistor T.

The impurity diffusion region 61 formed in the above-described manner is referred to as the low concentration impurity diffusion region in order to be distinguished from the impurity diffusion region 62, which will be described later. The impurity diffusion region 62 will be formed between the gate electrodes 31.

The fourth process will be described with reference to FIGS. 6 to 8.

According to the fourth process, the gate trench 31A which is shallower than the first isolation trench 32A is formed between the first isolation trenches 32A formed in the first processes while the second isolation trench 32B is formed by removing part of the insulating film 25 so that the insulating film 25 remains at the bottom of the first isolation trench 32A.

Hereinafter, the fourth process will be described in detail.

Figure 6:
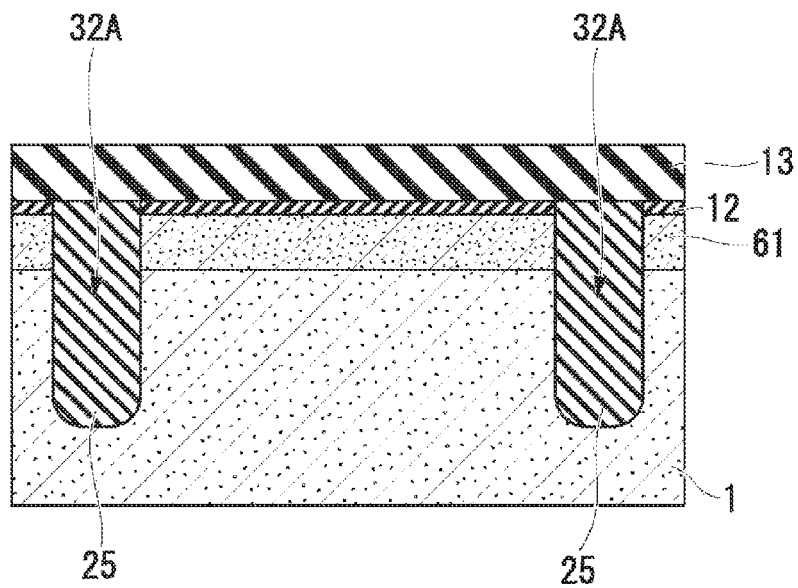
FIG. 6 is a fragmentary cross-sectional elevation view, taken along the B-B' line of FIG. 1A, illustrating the semiconductor device in a step, subsequent to FIG. 5, involved in the method of forming the semiconductor device of FIG. 1A in accordance with the first preferred embodiment of the present invention.

As shown in FIG. 6, a silicon nitride material is deposited by LP-CVD (Low-Pressure CVD) to cover the silicon oxide film 12, thereby forming the silicon nitride film 13 with a thickness of, for example, approximately 150 nm.

Figure 7:
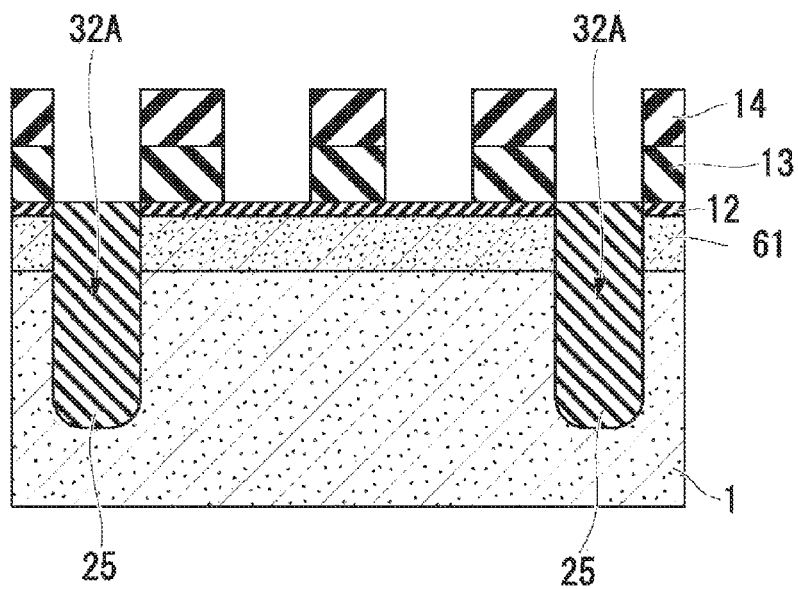
FIG. 7 is a fragmentary cross-sectional elevation view, taken along the B-B' line of FIG. 1A, illustrating the semiconductor device in a step, subsequent to FIG. 6, involved in the method of forming the semiconductor device of FIG. 1A in accordance with the first preferred embodiment of the present invention.

As shown in FIG. 7, resist patterns 14 with a width of approximately 40 nm is formed with 90 nm pitch by an immersion lithography process using immersion lithography materials, for example. The silicon nitride film 13 is anisotropically etched using the resist patterns 14 as masks. By doing this, a top surface of the insulating film 25 buried in the first isolation trench 32A and the silicon oxide film 12 are exposed.

Figure 8:
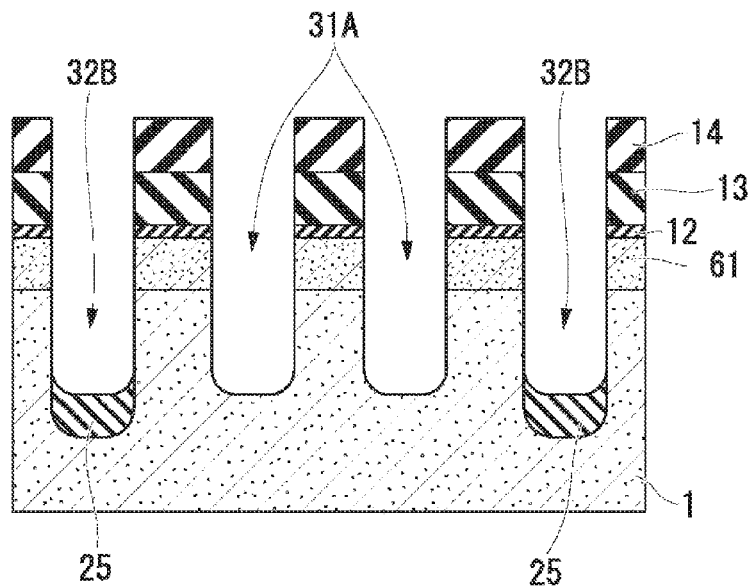
FIG. 8 is a fragmentary cross-sectional elevation view, taken along the B-B' line of FIG. 1A, illustrating the semiconductor device in a step, subsequent to FIG. 7, involved in the method of forming the semiconductor device of FIG. 1A in accordance with the first preferred embodiment of the present invention.

As shown in FIG. 8, the silicon oxide film 12 is anisotropically etched and removed, thereby exposing the top surface of the semiconductor substrate 1.

The semiconductor substrate 1 whose top surface is exposed and the insulating film 25 remaining in the first isolation trench 32A are simultaneously and anisotropically etched. In the process, the etching depth may be set to be, for example, approximately 150 nm. As etching gas for the anisotropic etching process, mixed gas of CF$_4$ and Ar to which H$_2$ is added may be used.

By doing this, the second isolation trench 32B which has substantially the same depth as the gate trench 31A is formed in the first isolation trench 32A together with forming the gate trench 31A which is shallower than the first isolation trench 32A between the first isolation trenches 32A. The gate trench 31A and the second isolation trench 32B are formed to be in a line-shape pattern so as to extend in the predetermined direction crossing the active region 1A, for example, the Y-direction in FIG. 1A.

Here, the etching depth of the insulating film 25 which is buried in the first isolation trench 32A with the depth of 180 nm is set to be approximately 150 nm. Therefore, the insulating film 25 with a thickness of approximately 30 nm remains below the second isolation trench 32B.

The fifth processes will be described.

Figure 9:
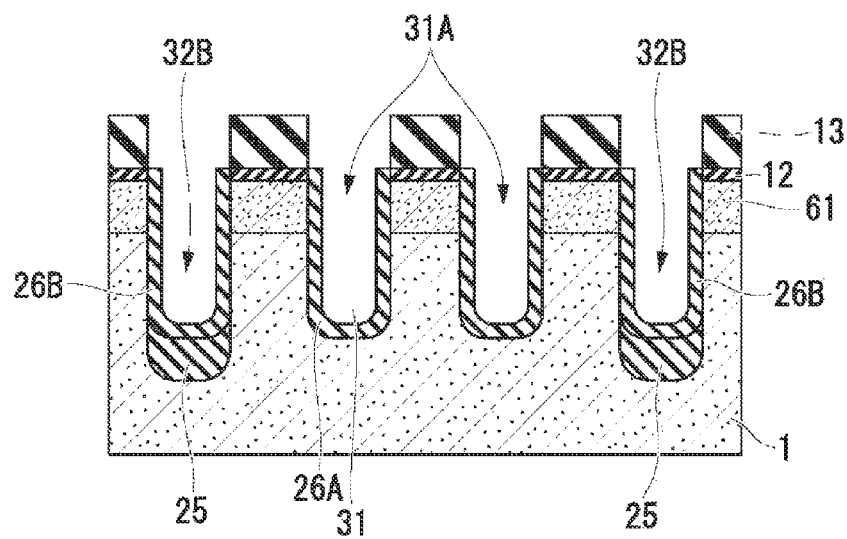
FIG. 9 is a fragmentary cross-sectional elevation view, taken along the B-B' line of FIG. 1A, illustrating the semiconductor device in a step, subsequent to FIG. 8, involved in the method of forming the semiconductor device of FIG. 1A in accordance with the first preferred embodiment of the present invention.

As shown in FIG. 9, after removing the resist pattern 14 used in the fourth process, the thermal oxidation films 26A and 26B are formed to cover the inner surfaces of the gate trench 31A and the second isolation trench 32B, respectively. For example, the thermal oxidation films 26A and 26B with a thickness of approximately 4 nm may be formed.

For example, the thermal oxidation films 26A and 26B may be formed by thermal oxidation of ISSG (in-situ steam generation) of the inner surface layers of the gate trench 31A and the second isolation trench 32B.

The thermal oxidation film 26A formed on the inner surface of the gate trench 31A functions as a gate insulating film. Hereinafter, the thermal oxidation film 26A is referred to as the gate insulating film 26A in order to distinguish from the thermal oxidation film 26B formed on the inner surface of the second isolation trench 32B.

Figure 10:
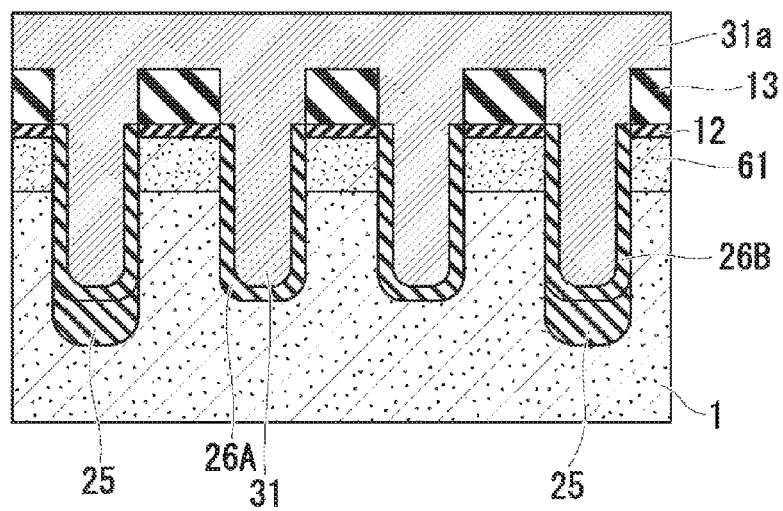
FIG. 10 is a fragmentary cross-sectional elevation view, taken along the B-B' line of FIG. 1A, illustrating the semiconductor device in a step, subsequent to FIG. 9, involved in the method of forming the semiconductor device of FIG. 1A in accordance with the first preferred embodiment of the present invention.

As shown in FIG. 10, a lamination layer 31a is formed to cover the inner surfaces of the gate trench 31A and the second isolation trench 32B and the silicon nitride film 13.

For example, a titanium nitride film is deposited as a bottom layer in the gate trench 31A and the second isolation trench 32B. A tungsten film is deposited on the bottom layer, thereby forming the lamination layer 31a including the titanium nitride film and the tungsten film. The titanium nitride film with a thickness of approximately 5 nm and the tungsten film with a thickness of approximately 80 nm may be formed, for example.

Figure 11:
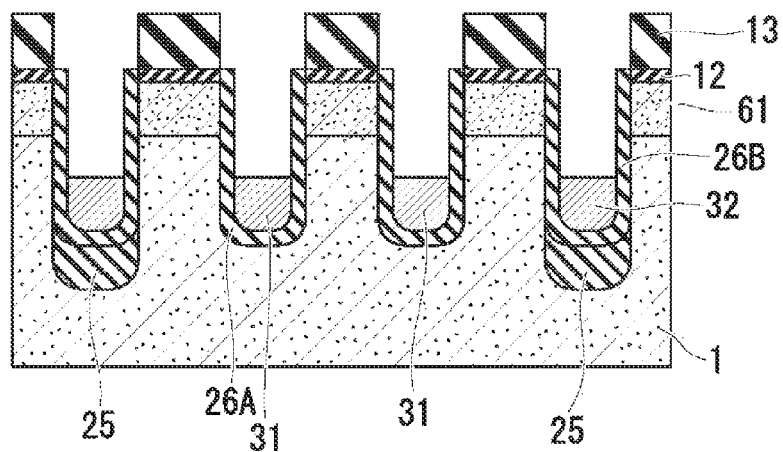
FIG. 11 is a fragmentary cross-sectional elevation view, taken along the B-B' line of FIG. 1A, illustrating the semiconductor device in a step, subsequent to FIG. 10, involved in the method of forming the semiconductor device of FIG. 1A in accordance with the first preferred embodiment of the present invention.

As shown in FIG. 11, part of the lamination film 31a is removed by an etching back process such as a dry etching process using the silicon nitride film 13 as a mask so that the lamination layer 31a remains at the bottoms of the gate trench 31A and the second isolation trench 32B. Thereby, the gate electrode 31 is formed in the gate trench 31A and the isolation electrode 32 is formed in the second isolation trench 32B.

The thickness of the lamination layer 31a which remains in the gate trench 31A and the second isolation trench 32B is adjusted so that top surfaces of the gate electrode 31 and the isolation electrode 32 are apart from the bottom of the low concentration impurity diffusion region 61.

When the part of the lamination layer 31a is removed by the etching back process, the etching back process may be performed until the top surface of the lamination layer 31a becomes approximately 70 nm lower than the surface of the semiconductor substrate 1 which is the top end of the gate trench 31A.

Figure 12:
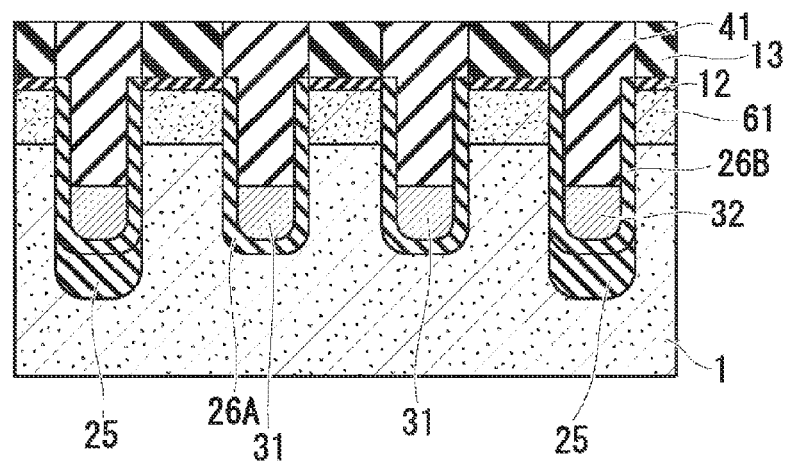
FIG. 12 is a fragmentary cross-sectional elevation view, taken along the B-B' line of FIG. 1A, illustrating the semiconductor device in a step, subsequent to FIG. 11, involved in the method of forming the semiconductor device of FIG. 1A in accordance with the first preferred embodiment of the present invention.

As shown in FIG. 12, a plasma oxidation film with a thickness of, for example, 140 nm, is deposited over the top surfaces of gate electrode 31 and the isolation electrode 32 and the top surface of the silicon nitride film 13. Then, polishing is performed by CMP so that the top surface of the silicon nitride film 13 is exposed and the plasma oxidation film on the silicon nitride film 13 is removed. By doing this, the first interlayer insulating film 41 made of the plasma oxidation film is formed over the gate electrode 31 and the isolation electrode 32.

A later process after the fifth process will be explained.

Figure 13:
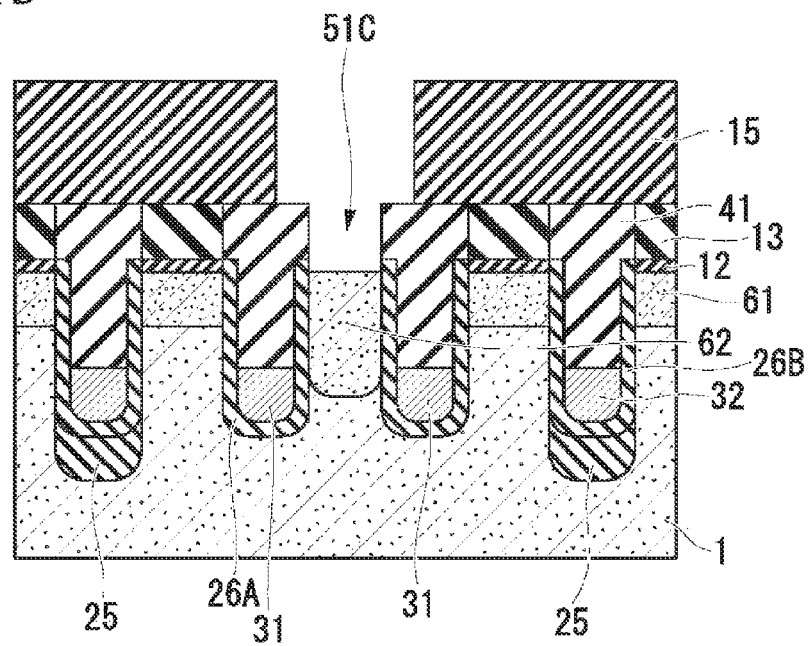
FIG. 13 is a fragmentary cross-sectional elevation view, taken along the B-B' line of FIG. 1A, illustrating the semiconductor device in a step, subsequent to FIG. 12, involved in the method of forming the semiconductor device of FIG. 1A in accordance with the first preferred embodiment of the present invention.

As shown in FIG. 13, a resist pattern for bit line 15 is formed by a lithography process. The silicon nitride film 13 is selectively removed by a dry etching process, thereby forming a contact hole 51C for a connection between the semiconductor substrate 1 and the bit line 51.

The contact hole 51C is formed as an opening pattern in a line-shape extending in parallel to the gate electrode 31 which is provided as the word line in plan view as shown in FIG. 1A. The silicon surface of the semiconductor substrate 1 is shown through the contact hole 51C in a region where the opening pattern of the contact hole 51C crosses the active region 1A.

As shown in FIG. 13, the impurity element of the higher concentration is introduced into the low concentration impurity diffusion region 61 which is disposed between gate electrodes 31 and shown through the contact hole 51C. Thereby, the high concentration impurity diffusion region 62 is formed.

For example, phosphorus (impurity element) is ion-implanted with an acceleration energy of 5 keV and an ion implant dose of $2\times10^{15}$ atoms/cm$^2$ into the surface of the semiconductor substrate shown through the contact hole 51C. Then, a heat treatment is performed at 950° C. for 10 seconds, thereby forming the high concentration impurity diffusion region 62. In the process, the impurity element is ion-implanted into the semiconductor substrate using the first interlayer insulating film 41 as a mask. The high concentration impurity diffusion region 62 functions as the other of the source and drain regions of the buried gate transistor T.

The high concentration impurity diffusion region 62 has a greater depth than the low concentration impurity diffusion region 61 by further implanting the impurity element into the low concentration impurity diffusion region 61.

Figure 14:
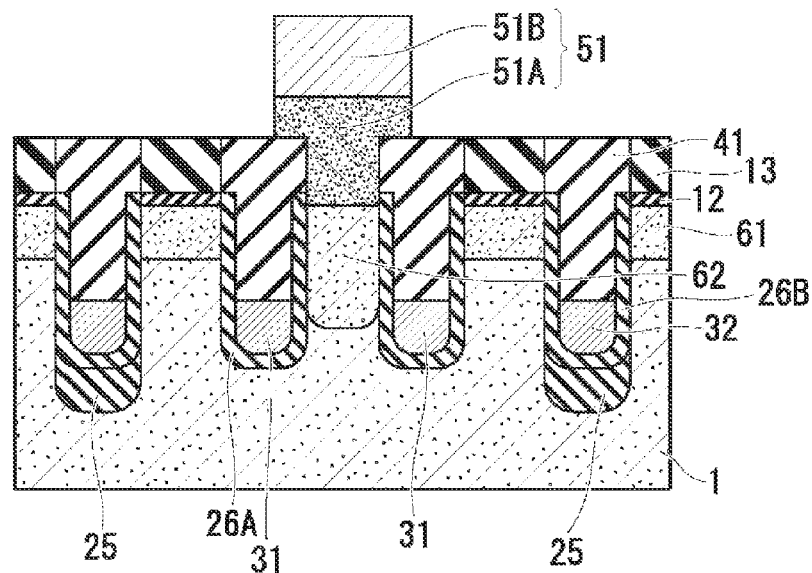
FIG. 14 is a fragmentary cross-sectional elevation view, taken along the B-B' line of FIG. 1A, illustrating the semiconductor device in a step, subsequent to FIG. 13, involved in the method of forming the semiconductor device of FIG. 1A in accordance with the first preferred embodiment of the present invention.

As shown in FIG. 14, after removing the resist pattern for bit line 15, the bit line 51 is formed over the high concentration impurity diffusion region 62.

For example, the polysilicon 51A with a thickness of approximately 80 nm is formed to cover the surface of the semiconductor substrate 1 shown through the contact hole 51C and the surface of the first interlayer insulating film 41. The polysilicon 51A is doped with phosphorus which is an n-type impurity with a concentration of approximately $1\times10^{20}$ atoms/cm$^3$. In the process, the polysilicon 51A is formed to fully fill the contact hole 51C.

A tungsten nitride (WN) film with a thickness of approximately 5 nm and a tungsten (W) film with a thickness of approximately 70 nm are sequentially deposited over the polysilicon 51A, thereby forming a W/WN film 51B, for example.

As shown in FIG. 14, a lamination of the W/WN film 51B and the polysilicon 51A is patterned in a line-shape by a lithography process and dry etching process, thereby forming the bit line 51.

The bit line 51 is connected to the high concentration impurity diffusion region 62 in the contact hole 51C. The polysilicon 51A configuring the bit line 51 is connected to the high concentration impurity diffusion region 62 shown through the contact hole 51C.

The bit line 51 according to the present embodiment also functions as a contact plug connected to the high concentration impurity diffusion region 62 which is the other of the source and drain region of the buried gate transistor T. According to the method of forming the semiconductor device of the present embodiment, the bit line 51 which also functions as the contact plug can be formed by a single lithography step as shown in the above described process.

According to the present embodiment, the bit line 51 is formed so as to extend in a direction crossing the gate electrode 31 and the isolation electrode 32, which is the X-direction in FIG. 1A, but is not limited thereto. For example, the bit line 51 may be arranged so that part of the bit line 51 is curved.

Figure 15:
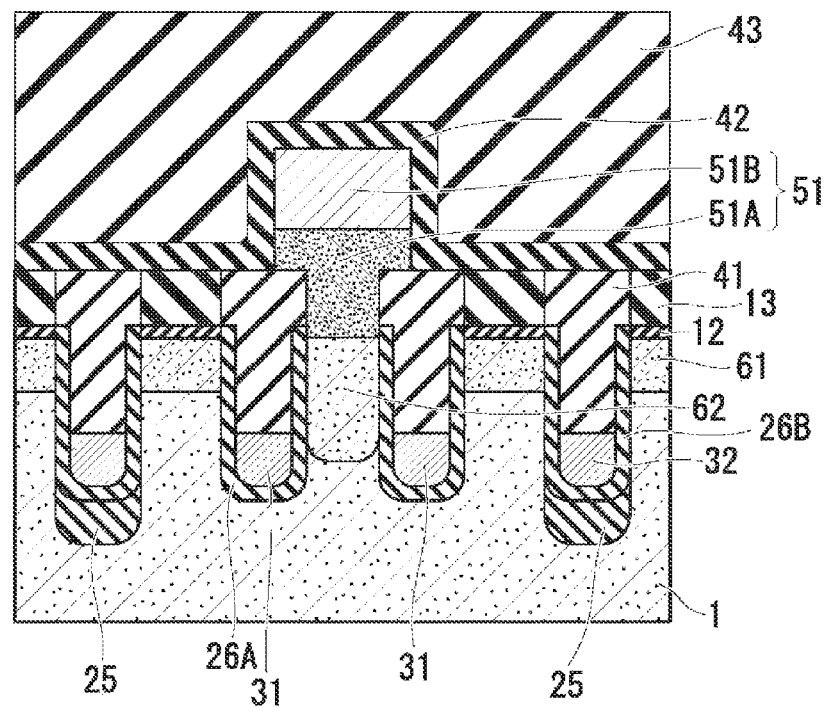
FIG. 15 is a fragmentary cross-sectional elevation view, taken along the B-B' line of FIG. 1A, illustrating the semiconductor device in a step, subsequent to FIG. 14, involved in the method of forming the semiconductor device of FIG. 1A in accordance with the first preferred embodiment of the present invention.

As shown in FIG. 15, a silicon nitride is deposited to cover the surface of the semiconductor substrate 1, the surface of the first interlayer insulating film 41, and the bit line 51 by LP-CVD, thereby forming the second interlayer insulating film 42 with a thickness of approximately 10 nm.

As shown in FIG. 15, the third interlayer insulating film 43 is formed between the second interlayer insulating film 42 and the wiring layer M which will be formed in the later steps.

For example, a silicon oxide film including boron and phosphorus, that is, a BPSG (Boron Phosphorus Silicate Glass) with a thickness of approximately 400 nm is deposited by CVD so as to cover the second interlayer insulating film 42. Subsequently, a reflow process is performed at 750° C. for approximately 30 minutes, thereby forming the third interlayer insulating film 43.

Figure 16:
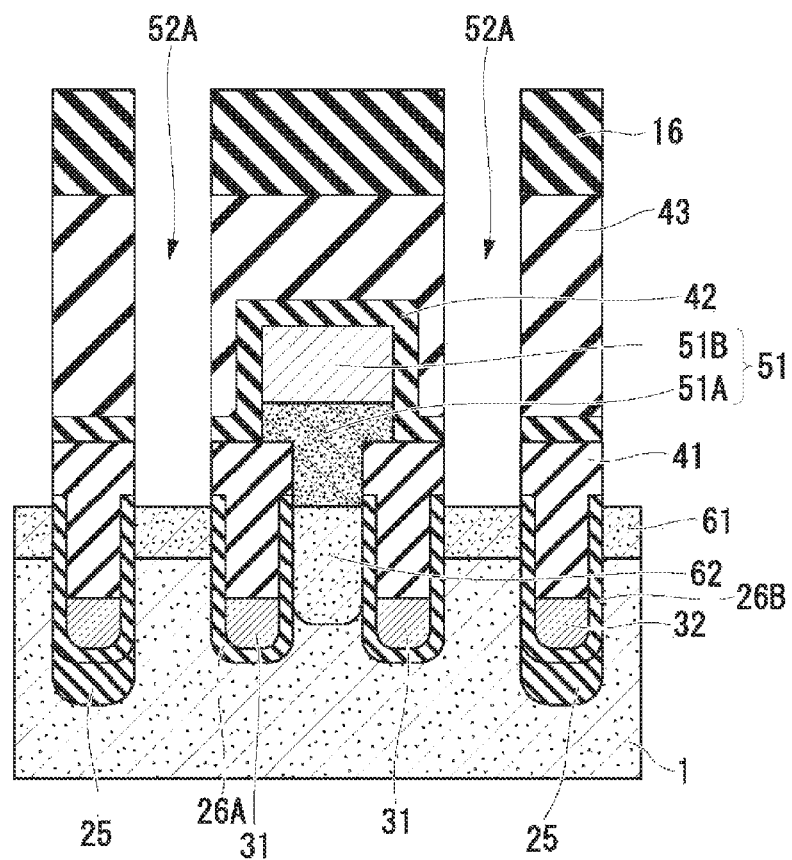
FIG. 16 is a fragmentary cross-sectional elevation view, taken along the B-B' line of FIG. 1A, illustrating the semiconductor device in a step, subsequent to FIG. 15, involved in the method of forming the semiconductor device of FIG. 1A in accordance with the first preferred embodiment of the present invention.

As shown in FIG. 16, a resist pattern for capacitor 16 is formed by lithography process. Subsequently, the third interlayer insulating film 43 is anisotropically etched using the resist pattern for capacitor 16 as a mask, thereby forming the capacitor contact hole 52A.

For example, the resist pattern for capacitor 16 is formed over the third interlayer insulating film 43 so as to have an opening pattern in a line-shape extending in parallel to the gate electrode 31.

A capacitor contact hole 52A is formed by sequentially etching and removing the third interlayer insulating film 43, the second interlayer insulating film 42, the silicon nitride film 13, and the silicon oxide insulating film 12 which are exposed from the resist pattern for capacitor 16.

As shown in FIG. 16, the silicon surface of the semiconductor substrate 1 is shown through the capacitor contact hole 52A in a region where the capacitor contact hole 52A overlaps the active region 1A.

A polysilicon layer for capacitor 52a with a thickness of approximately 80 nm is deposited to cover the third interlayer insulating film 43 by LP-CVD. The polysilicon layer for capacitor 52a is doped with phosphorus which is an n-type impurity element with a concentration of approximately $1\times10^{20}$/cm$^3$, for example. At this process, the polysilicon layer for capacitor 52a is formed to fully fill the capacitor contact hole 52A.

Figure 17:
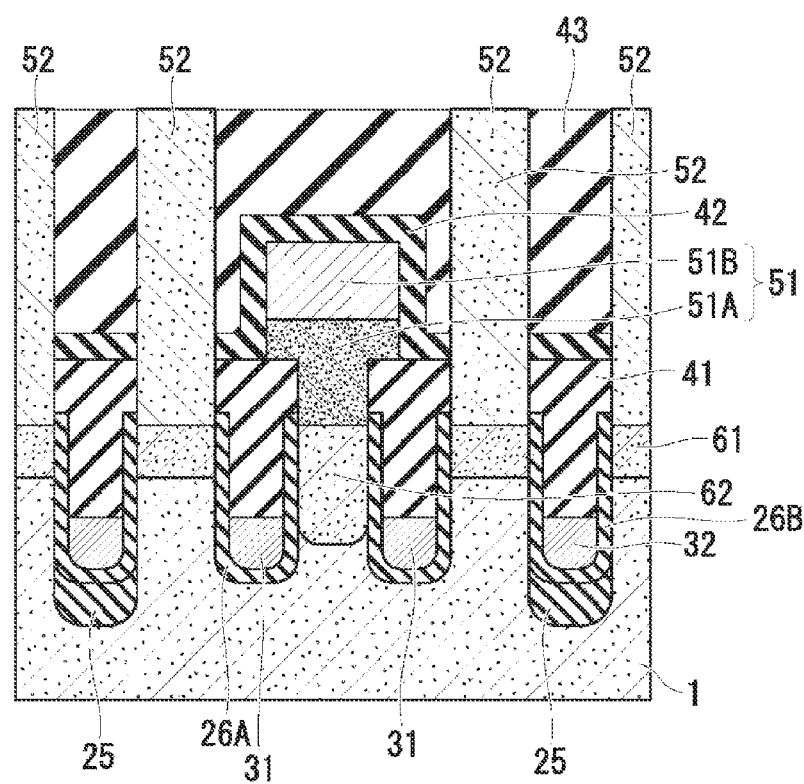
FIG. 17 is a fragmentary cross-sectional elevation view, taken along the B-B' line of FIG. 1A, illustrating the semiconductor device in a step, subsequent to FIG. 16, involved in the method of forming the semiconductor device of FIG. 1A in accordance with the first preferred embodiment of the present invention.

The polysilicon for capacitor 52a over the third interlayer insulating film 43 is polished and removed by CMP as shown in FIG. 17. By doing this, the capacitor contact plug 52 is formed to fill the capacitor contact hole 52A.

Figure 23A:
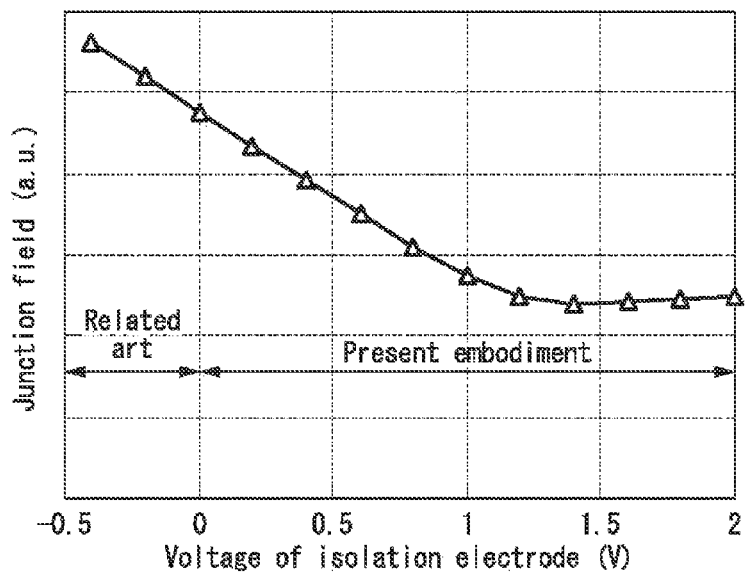
FIG. 23A is a graph showing a change of junction field on a capacitor side in a state where a buried gate transistor retains charge according to the first preferred embodiment of the present invention and according to the related art.

FIG. 23A is a graph showing a change of junction field on a capacitor side in a state where the buried gate transistor retains charge according to the first preferred embodiment of the present invention and according to the related art. A horizontal axis indicates a voltage applied to the isolation electrode. A capacitance voltage in the charge retaining state is 1V.

0V or negative voltage has been applied to the isolation electrode in the related art. According to the present embodiment, it is shown that the junction field is eased by applying positive voltage.

Figure 23B:
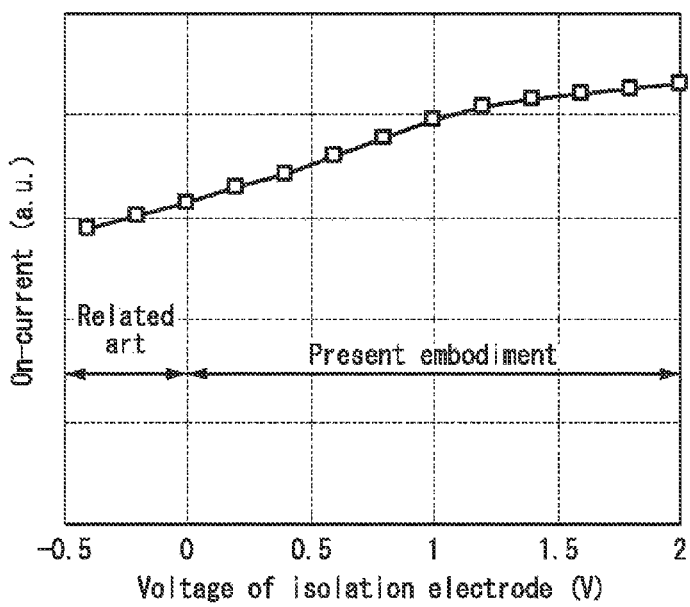
FIG. 23B is a graph showing a change of on-current according to the first preferred embodiment of the present invention and according to the related art.

FIG. 23B is a graph showing a change of on-current according to the first preferred embodiment of the present invention and according to the related art. According to the present embodiment, it is shown that an electron density in the low concentration impurity diffusion region of the transistor is increased by applying positive voltage to the isolation electrode, thereby improving the on-current.

According to FIGS. 23A and 23B, a voltage applied to the isolation electrode is preferably 1V for the transistor according to the present embodiment. Since the insulating film with a thickness of approximately 30 nm is disposed below the isolation electrode, the transistor for isolation is not turned on even if 1V is applied to the isolation electrode.

According to the present embodiment, the semiconductor device (DRAM 10) illustrated in FIGS. 1A and 1B is formed by forming the capacitor C and the wiring layer M over the above-described buried gate transistor T.

Figure 18:
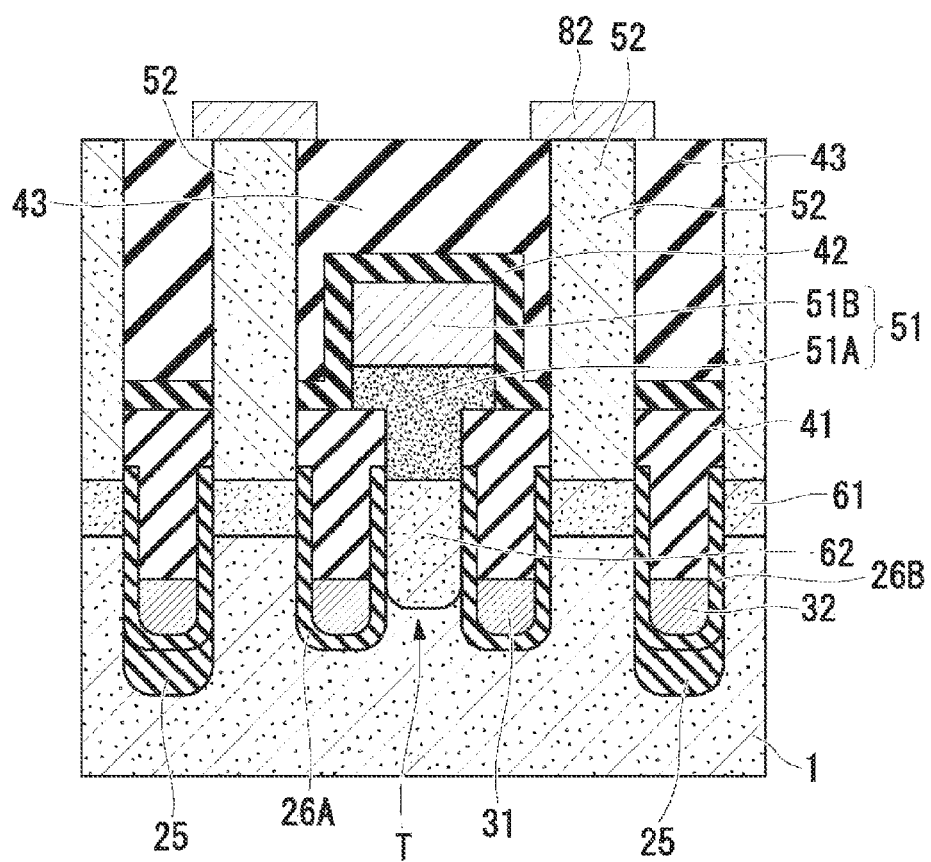
FIG. 18 is a fragmentary cross-sectional elevation view, taken along the B-B' line of FIG. 1A, illustrating the semiconductor device in a step, subsequent to FIG. 17, involved in the method of forming the semiconductor device of FIG. 1A in accordance with the first preferred embodiment of the present invention.

The capacitor C is formed. A tungsten nitride film and a tungsten film are sequentially deposited over the semiconductor substrate 1 over which the capacitor contact plug 52 is formed, thereby forming a lamination layer. The capacitor contact pad 82 as shown in FIG. 18 is formed by patterning the lamination layer.

In the memory cell region, the capacitor contact pads 82 should be formed at equal intervals. Therefore, the capacitor contact pad 82 is deviated from immediately above the capacitor contact plug 52 in plan view. The capacitor contact pad 82 is connected to the capacitor contact plug 52 at the position where the bottom of the capacitor contact pad 82 overlaps the top of the capacitor contact plug 52.

Figure 19:
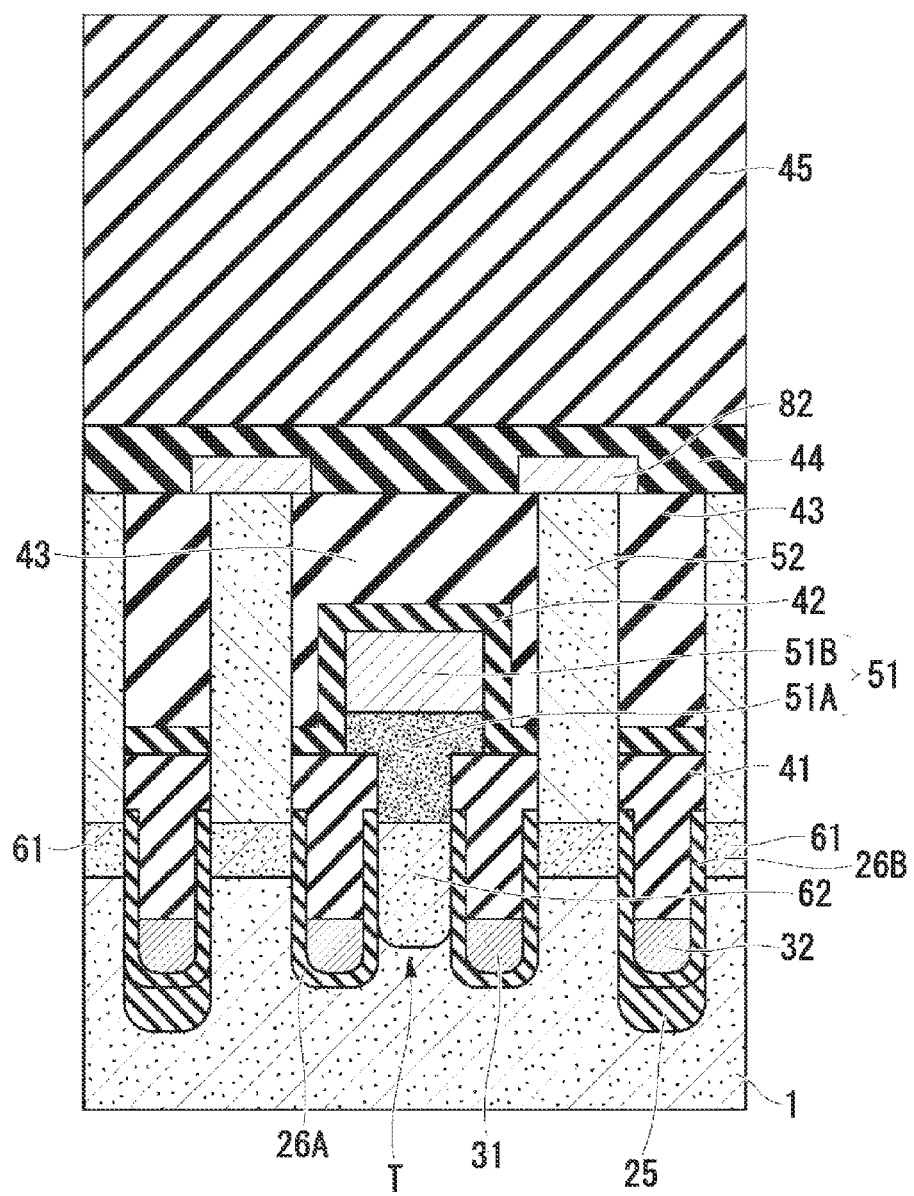
FIG. 19 is a fragmentary cross-sectional elevation view, taken along the B-B' line of FIG. 1A, illustrating the semiconductor device in a step, subsequent to FIG. 18, involved in the method of forming the semiconductor device of FIG. 1A in accordance with the first preferred embodiment of the present invention.

As shown in FIG. 19, the fourth interlayer insulating film 44 is formed over the semiconductor substrate 1 so as to cover the capacitor contact pad 82. The fourth interlayer insulating film 44 may be, but is not limited to, a silicon nitride film. The fifth interlayer insulating film 45 is formed over the fourth interlayer insulating film 44. The fifth interlayer insulating film 45 may be, but is not limited to, a silicon oxide film.

Figure 20:
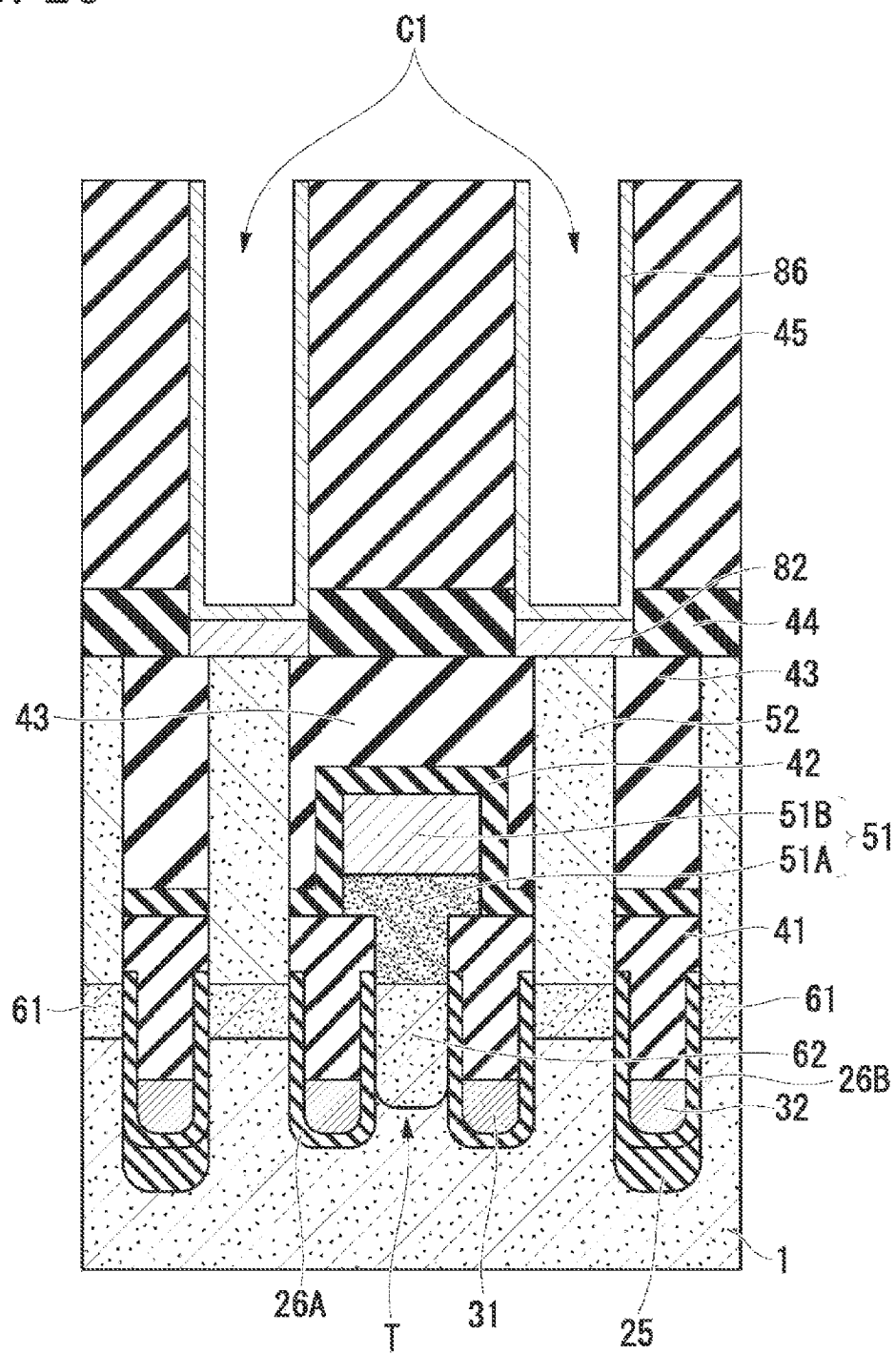
FIG. 20 is a fragmentary cross-sectional elevation view, taken along the B-B' line of FIG. 1A, illustrating the semiconductor device in a step, subsequent to FIG. 19, involved in the method of forming the semiconductor device of FIG. 1A in accordance with the first preferred embodiment of the present invention.

As shown in FIG. 20, the capacitor contact pad 82 is partially exposed by forming a contact hole for capacitor C1. The contact hole for capacitor C1 penetrates the fifth interlayer insulating film 45 and the fourth interlayer insulating film 44 which is disposed over the capacitor contact pad 82.

The first electrode 86 which is part of the capacitor C is formed so as to cover an inner surface of the contact hole for capacitor C1 and the top surface of the capacitor contact pad 82 which is partly exposed. The first electrode 86 may include, but is not limited to, titanium nitride. By doing this, the bottom of the first electrode 86 is connected to the top of the capacitor contact pad 82.

Figure 21:
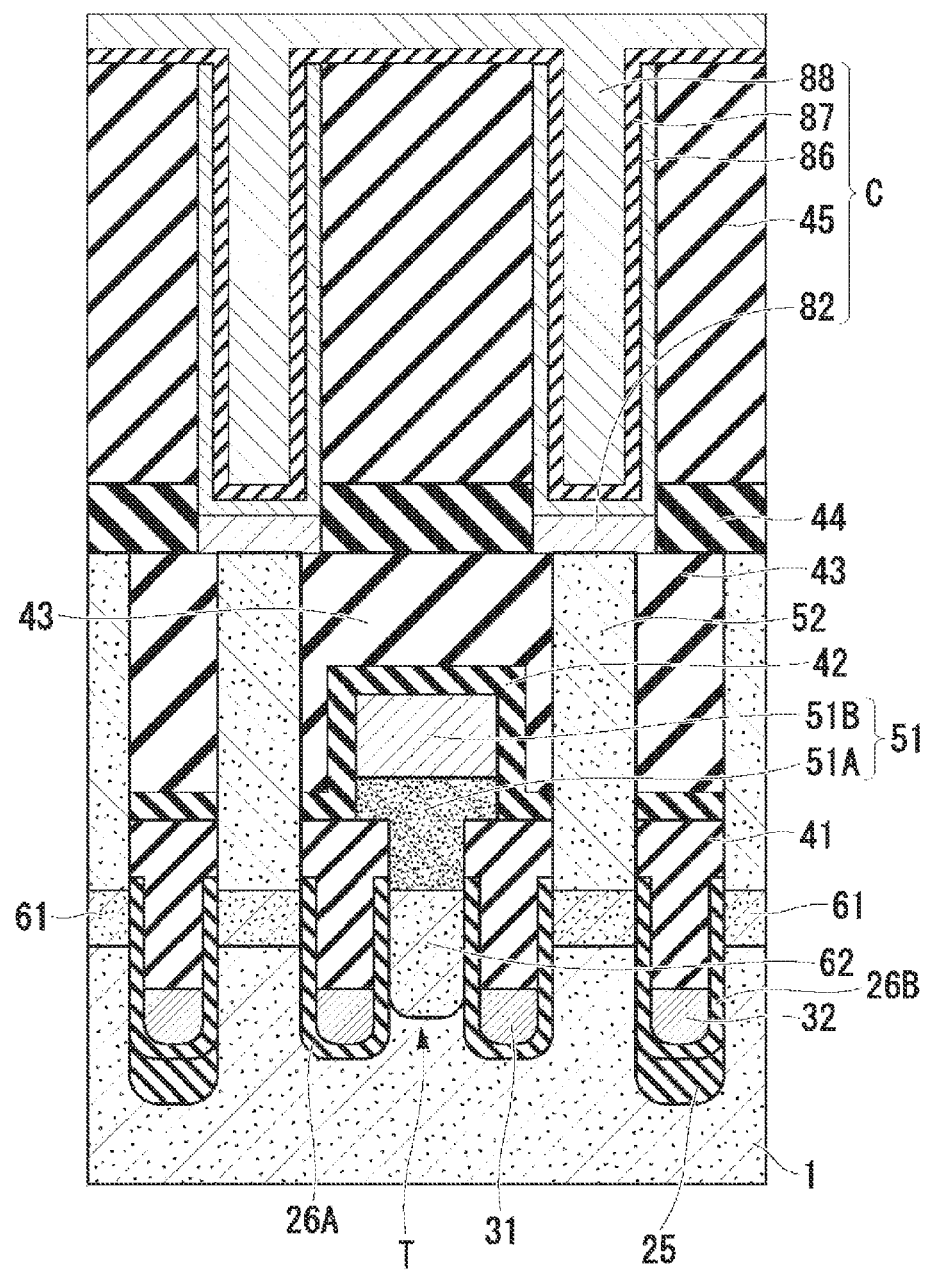
FIG. 21 is a fragmentary cross-sectional elevation view, taken along the B-B' line of FIG. 1A, illustrating the semiconductor device in a step, subsequent to FIG. 20, involved in the method of forming the semiconductor device of FIG. 1A in accordance with the first preferred embodiment of the present invention.

As shown in FIG. 21, the capacitor insulating film 87 is formed over the fifth interlayer insulating film 45 so as to cover the surface of the first electrode 86. The capacitor insulating film 87 may include, but is not limited to, zirconium oxide ($ZrO_2$), aluminum oxide ($Al_2O_3$), hafnium oxide ($HfO_2$) or a lamination thereof. The second electrode 88 which is part of the capacitor C is formed so as to cover the capacitor insulating film 87. The second electrode 88 may include, but is not limited to, titanium nitride.

As described above, the capacitor C which is connected to the low concentration impurity diffusion region 61 of the buried gate transistor T via the capacitor contact plug 52 is formed.

Figure 22:
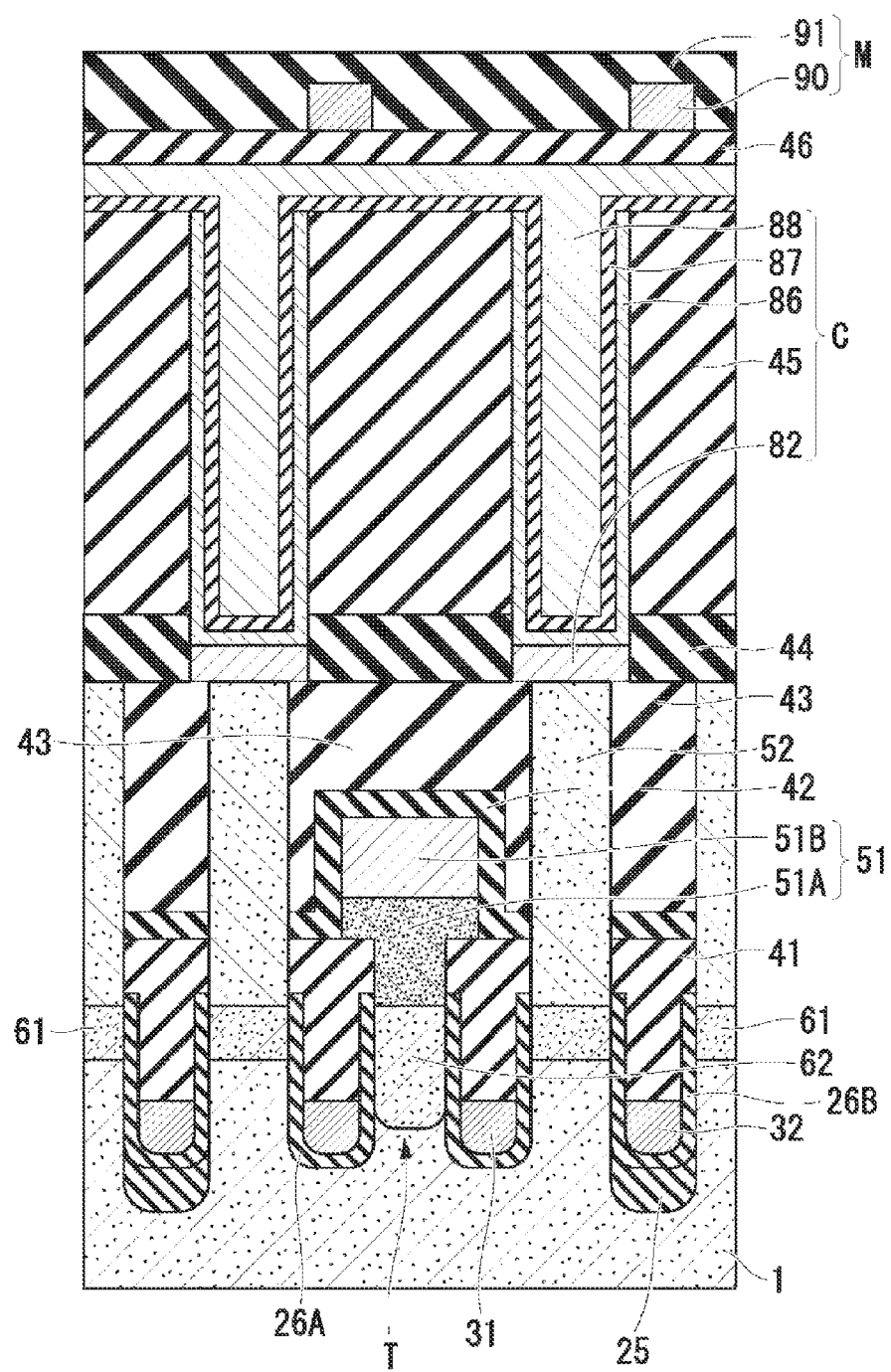
FIG. 22 is a fragmentary cross-sectional elevation view, taken along the B-B' line of FIG. 1A, illustrating the semiconductor device in a step, subsequent to FIG. 21, involved in the method of forming the semiconductor device of FIG. 1A in accordance with the first preferred embodiment of the present invention.

The wiring layer M is formed over the semiconductor substrate 1 while the capacitor C is interposed between the wiring layer M and the semiconductor substrate 1. As shown in FIG. 22, the sixth interlayer insulating film 46 is formed over the second electrode 88 to cover the second electrode 88. The sixth interlayer insulating film 46 may be, but is not limited to, a silicon oxide film. The upper metal wiring 90 is formed over the sixth interlayer insulating film 46. The upper metal wiring 90 may include, but is not limited to, aluminum or copper. Then, the wiring protection film 91 is formed to cover the upper metal wiring 90. Thereby, the memory cell of the DRAM 10 is formed.

Through the above-described processes, the DRAM 10 illustrated in FIGS. 1A and 1B according to the present embodiment can be formed.

According to the semiconductor device of the present embodiment as described above, the adjacent transistors are electrically isolated by the buried isolation electrode 32. Since the insulating film 25 below the isolation electrode 32 is thicker than the gate insulating film 26A, only the threshold voltage of the isolation electrode 32 can be set to be high. Namely, the threshold voltage of the isolation electrode 32 is higher than that of the gate electrode 31. Thereby, a channel is not formed below the isolation electrode 32.

Since the insulating film 25 below the isolation electrode 32 is thicker than the gate insulating film 26A, the junction field can be eased by applying the same bias voltage to the isolation electrode 32 as the gate electrode 31. As a result, the junction leakage current can be reduced. Additionally, a decrease of the electron density in the vicinity of the isolation electrode 32 can be suppressed. Thereby, a decrease of the on-current of the transistor can be prevented.

Since sufficient current driving capacity for writing and reading the charge to/from the cell capacitor can be secured, a semiconductor device which has a better element property than in the related art can be obtained.

According to the semiconductor device of the present embodiment, the concentration of the impurity diffusion region on the capacitor side is set to be lower than that of the impurity diffusion region on the bit line side. Thereby, the junction field on the capacitor side can be lowered.

According to the method of forming the semiconductor device, the first isolation trench 32A which is deeper than the second isolation trench 32B is formed before forming the second isolation trench 32B in which the isolation electrode 32 is buried. The insulating film 25 is formed at the bottom of the first isolation trench 32A. By doing this, the insulating film 25 which is thicker than the gate insulating film 26A can be formed below the isolation electrode 32. The semiconductor device in which the junction field is eased by applying the same bias voltage to the isolation electrode 32 as the gate electrode 31 can be formed by adding the processes for forming the first isolation trench 32A and forming the insulating film 25.

The semiconductor device in which the junction leakage current can be reduced can be formed. The semiconductor device in which the decrease of the electron density in the vicinity of the isolation electrode 32 can be suppressed can be formed. The semiconductor device in which the decrease of the on-current of the transistor can be prevented can be formed.

Second Embodiment

A semiconductor device according to the second embodiment will be described.

Figure 24:
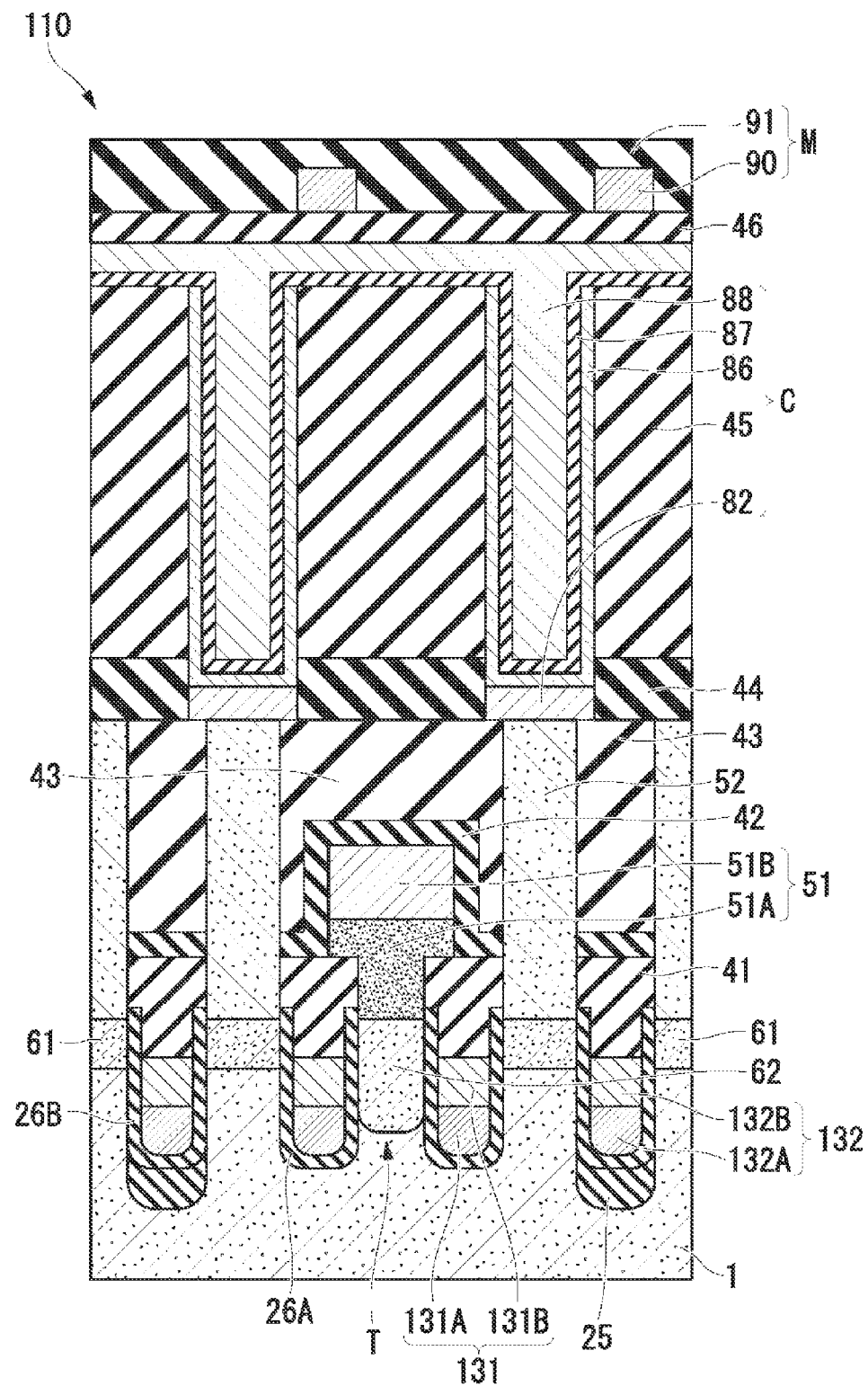
FIG. 24 is a fragmentary cross-sectional elevation view illustrating a semiconductor device including a memory cell in accordance with the second preferred embodiment of the present invention.

FIG. 24 is a fragmentary cross-sectional elevation view illustrating a semiconductor device including a memory cell in accordance with the second preferred embodiment of the present invention. In FIG. 24, the same parts as those in the first embodiment are denoted by the same reference numerals.

A semiconductor device 110 according to the present embodiment includes a gate electrode 131 which is a lamination electrode of an upper electrode 131B and a lower electrode 131A as shown in FIG. 24. The semiconductor device 110 includes an isolation electrode 132 which is a lamination electrode of an upper electrode 132B and a lower electrode 132A.

The upper electrode 131B includes a gate electrode material having a different work function from that of a gate electrode material included in the lower electrodes 131A. The upper electrode 132B includes a gate electrode material having a different work function from that of a gate electrode material included in the lower electrodes 132A. The upper electrodes 131B and 132B include the gate electrode material having a lower work function than that of the gate electrode material included in the lower electrode 131A and 132A.

For example, a material having a work function in the range from 4.1 eV to 4.4 eV is preferably used for the upper electrodes 131B and 132B. A material having a work function in the range from 4.4 eV to 5.3 eV is preferably used for the lower electrodes 131A and 132A. According to the present embodiment, the materials used for the upper electrodes 131B and 132B and the lower electrodes 131A and 132A are not limited. For example, the upper electrodes 131B and 132B may include, but are not limited to, $N^+$ polysilicon, aluminum, or conductive carbon. The lower electrodes 131A and 132A may include, but are not limited to, a lamination of titanium nitride and tungsten or $N^+$ polysilicon.

According to the present embodiment, the gate electrode 131 preferably includes the upper electrode 131B including a material whose work function is lower than that of a material included in the lower electrode 131A. The isolation electrode 132 preferably includes the upper electrode 132B including a material whose work function is lower than that of a material included in the lower electrode 132A.

For example, a combination of the upper electrodes 131B and 132B/the lower electrodes 131A and 132A may be, but is not limited to, $N^+$ polysilicon/metal (a lamination of TIN and W), Al/metal (a lamination of TiN and W), conductive carbon/$N^+$ polysilicon, conductive carbon/metal (a lamination of TiN and W).

The method of forming the semiconductor device according to the present embodiment will be described.

The method of forming the semiconductor device according to the present embodiment is different from the first embodiment in terms of the fifth process. The semiconductor device according to the present embodiment can be formed by the same processes until the fourth process (refer to FIG. 9). Therefore, processes after the fourth process of the present embodiment will be described.

Figure 25:
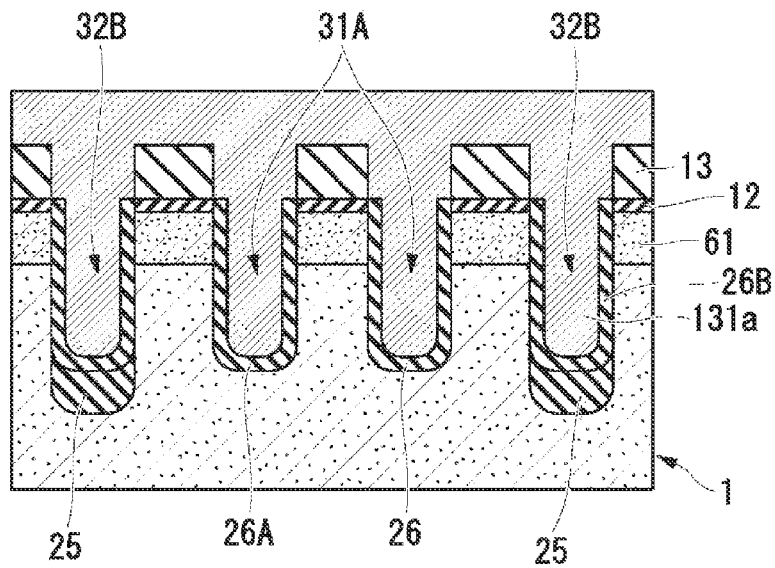
FIG. 25 is a fragmentary cross-sectional elevation view illustrating the semiconductor device involved in a method of forming the semiconductor device of FIG. 24 in accordance with the second preferred embodiment of the present invention.
Figure 26:
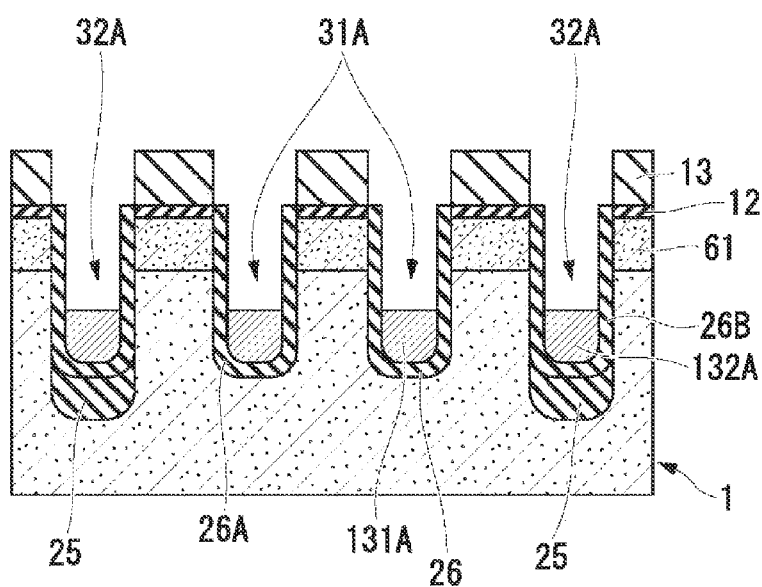
FIG. 26 is a fragmentary cross-sectional elevation view illustrating the semiconductor device in a step, subsequent to FIG. 25, involved in the method of forming the semiconductor device of FIG. 24 in accordance with the second preferred embodiment of the present invention.
Figure 27:
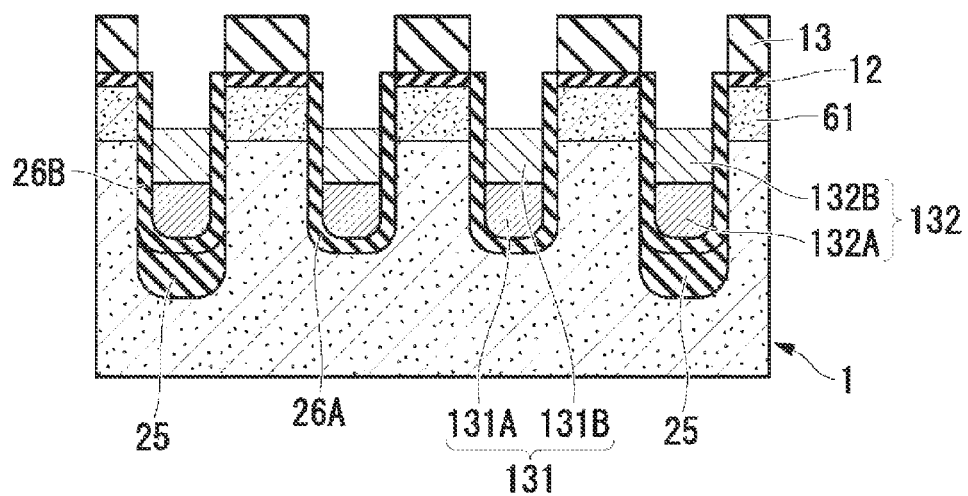
FIG. 27 is a fragmentary cross-sectional elevation view illustrating the semiconductor device in a step, subsequent to FIG. 26, involved in the method of forming the semiconductor device of FIG. 24 in accordance with the second preferred embodiment of the present invention.

FIGS. 25 to 27 are fragmentary cross-sectional elevation views illustrating the semiconductor device involved in a method of forming the semiconductor device of FIG. 24 in accordance with the second preferred embodiment of the present invention. The same parts as those of the semiconductor device 10 in the first embodiment are denoted by the same reference numerals in FIGS. 25 to 27.

As shown in FIG. 25, after removing the resist pattern 14 which was used in the fourth process, the thermal oxidation films 26A and 26B are formed to cover inner surfaces of the gate trench 31A and the second isolation trench 32B in the same manner as the first embodiment. The thermal oxidation films 26A and 26B with a thickness of, for example, approximately 4 nm may be formed.

The thermal oxidation films 26A and 26B may be formed by thermal oxidation of the inner surfaces of the gate trench 31A and the second isolation trench 32B by ISSG (In-Situ Steam Generation), respectively, for example.

The thermal oxidation film 26A formed on the inner surface of the gate trench 311A functions as the gate insulating film. Hereinafter, the thermal oxidation film 26A is referred to as the gate insulating film 26A in order to distinguish from the thermal oxidation film 26B formed on the inner surface of the second isolation trench 32B.

As shown in FIG. 25, a titanium nitride film is deposited in the gate trench 31A and the second isolation trench 32B as a lower layer, for example. Then, a tungsten film is deposited over the titanium nitride film, thereby forming the laminated layer 131a of the titanium nitride film and the tungsten film.

In the process, the titanium nitride film with a thickness of approximately 5 nm and the tungsten film with a thickness of approximately 80 nm may be formed, for example.

As shown in FIG. 26, part of the laminated layer 131a is removed by an etching back process such as a dry etching process using the silicon nitride film 13 as a mask so that the laminated layer 131a remains at the bottom of the gate trench 31A and the second isolation trench 32B. Thereby, the lower electrodes 131A and 132A are formed. Although the lower electrodes 131A and 132A are formed of the same laminated layer 131a, the lower electrodes 131A and 132A are distinguished from each other by using different numerals since their functions are different from each other.

When the part of the laminated layer 131a is removed by the etching back process, the etching back process may be performed until the top surface of the lamination layer 131a becomes approximately 90 nm lower than the surface of the semiconductor substrate 1 which is the top end of the gate trench 31A.

As shown in FIG. 27, a polysilicon film with a thickness of approximately 80 nm which is doped with phosphorus with a of $1\times10^{20}$ atoms/cm$^3$ to $1\times10^{22}$ atoms/cm$^3$ is deposited over the lower electrodes 131A and 132A formed at the bottom of the gate trench 31A and the second isolation trench 32B. The polysilicon film is preferably doped with phosphorus with a concentration of $1\times10^{20}$ atoms/cm$^3$.

In the process, a vicinity of a boundary between the tungsten film, which is the upper layer of the lower electrodes 131A and 132A, and the polysilicon film becomes silicide. In order to suppress excessive silicidation, a barrier film or a low-resistance silicide film may be formed before depositing the polysilicon film. In the case where the polysilicon film is formed by depositing silicon in an amorphous state at approximately 520° C. and crystallizing amorphous silicon by heat treatment in order to make silicon crystal grains greater, an effect of low resistivity can be obtained.

The polysilicon film is etched back by a dry etching process using the silicon nitride film 13 as a mask until the top surface of the polysilicon film becomes approximately 70 nm lower than the surface of the semiconductor substrate 1. Thereby, the upper electrodes 131B and 132B including n-type polysilicon are formed over the lower electrodes 131A and 132A. Although the upper electrodes 131B and 132B are formed of the same n-type polysilicon film, the upper electrodes 131B and 132B are distinguished from each other by using the different numerals since their functions are different from each other.

Through the processes described above, the gate electrode 131 which is the lamination structure of the upper electrode 131B and the lower electrode 131A is formed in the gate trench 31A. The isolation electrode 132 which is the lamination structure of the upper electrode 132B and the lower electrode 132A is formed in the second isolation trench 32B.

The later processes from the process for forming the first interlayer insulating film 41 are the same as the first embodiment.

According to the present embodiment, the work functions of the upper electrode 131B and the lower electrode 131A which form the gate electrode 131 and the upper electrode 132B and the lower electrode 132A which form the isolation electrode 132 are set as described above. By doing this, a potential change in a direction from the low impurity diffusion region 61 to the silicon substrate 1 is eased and the junction field on the capacitor side is eased compared to the case where the gate electrode and the isolation electrode are made of only the lamination of the titanium nitride film and the tungsten film. Therefore, the junction leakage current can be reduced and sufficient current driving capacity can be secured.

Since the work functions of the upper electrodes 131B and 132B are lower than those of the lower electrodes 131A and 132A, electron density of the low impurity diffusion region 61 is increased compared to the case where the gate electrode 131 and the isolation electrode 132 are made of only the lamination of titanium nitride and tungsten. Thereby, the on-current of the transistor can be effectively increased.

According to the present embodiment, not only the isolation electrode 132 for isolating the elements but also the gate electrode 131 provided as the word line are formed to have the laminated structure described above, but are not limited thereto. According to the present embodiment, since the gate electrode 131 and the isolation electrode 132 are formed by the same processes, they have the same structure. However, the above described effect can be fully obtained if at least the isolation electrode 132 has the laminated structure described above.

For example, in the case where the gate electrode 131 and the isolation electrode 132 are formed by different processes, the isolation electrode 132 is formed to have the above-described structure and the gate electrode 131 provided as the word line may be made of only the lamination of the titanium nitride and tungsten.

Third Embodiment

A semiconductor device according to the third embodiment will be described.

In order to electrically isolate the adjacent transistors, only the threshold voltage of the isolation electrode should be sufficiently higher than the threshold voltage of the gate electrodes of the adjacent transistors. A method for making the threshold voltage of the isolation electrode higher is not limited to increasing the thickness of the insulating film formed below the isolation electrode as shown in the first embodiment.

Figure 28:
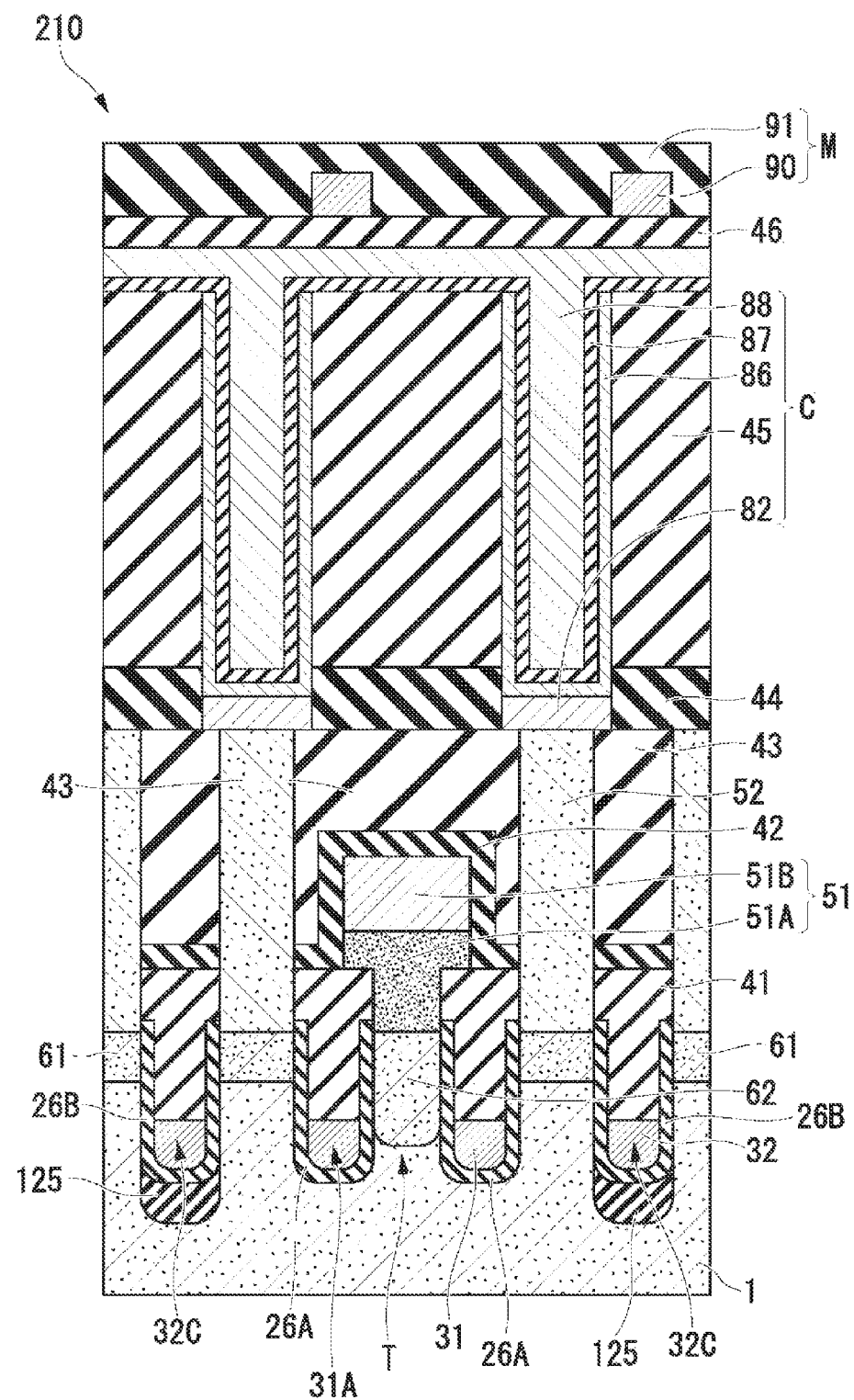
FIG. 28 is a fragmentary cross-sectional elevation view illustrating the semiconductor device including a memory cell in accordance with the third preferred embodiment of the present invention.
Figure 29:
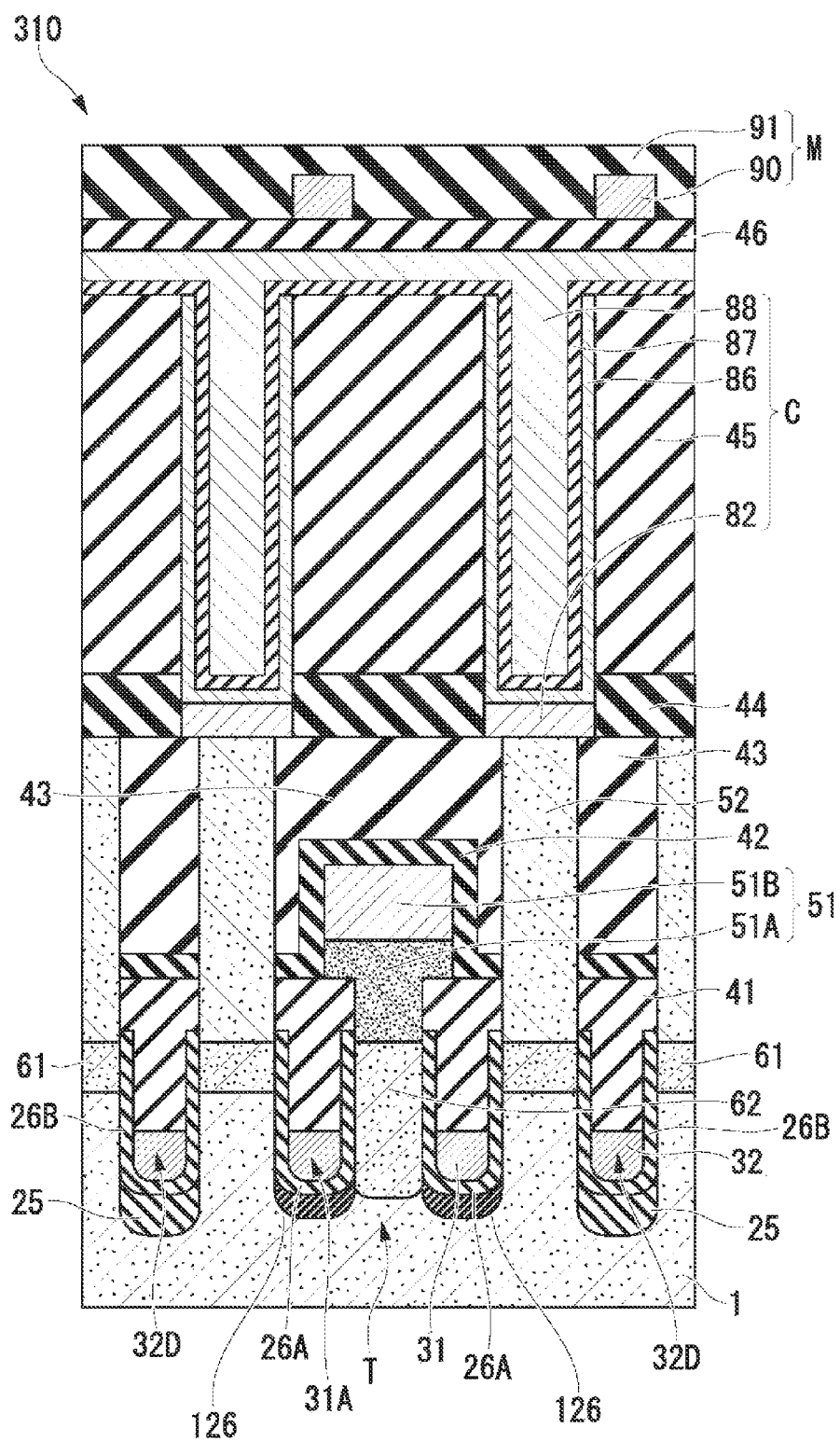
FIG. 29 is a fragmentary cross-sectional elevation view illustrating the semiconductor device including a memory cell in accordance with the third preferred embodiment of the present invention.

According to the present embodiment, a first impurity ion may be selectively implanted into a region 125 below the isolation electrode 32, which is a channel region, as shown in FIG. 28. A second impurity ion may be selectively implanted into a region 126 below the gate electrode 31, which is a channel region, as shown in FIG. 29.

FIG. 28 is a fragmentary cross-sectional elevation view illustrating the semiconductor device including a memory cell in accordance with the third preferred embodiment of the present invention. In FIG. 28, the same parts as those in the first embodiment are denoted by the same reference numerals.

In a semiconductor device 210, an impurity diffusion region 125 is formed below the isolation electrode 32. The impurity diffusion region 125 includes an impurity ion having the same conductivity type as the impurity ion included in the semiconductor substrate 1. A concentration of the impurity ion included in the impurity diffusion region 125 is higher than that of the impurity ion included in the semiconductor substrate 1.

According to the first embodiment, the first isolation trench 32A is deeper than the gate trench 31A. On the other hand, according to the present embodiment, the depth of the isolation trench 32C may be substantially the same as that of the gate trench 31A. In this case, the isolation trench 32C and the gate trench 32A can be formed by the same processes.

The method of forming the semiconductor device according to the present embodiment may include, but is not limited to, implanting the first impurity ion which has the same conductivity type as that of the impurity element included in the semiconductor substrate 1 into the region 125 below the isolation electrode 32 of the DRAM 10 provided with the buried gate transistor.

Alternatively, the second impurity ion which has a different conductivity type from that of the impurity element included in the semiconductor substrate 1 may be implanted into the region 126 below the gate electrode 31.

For example, a p-type impurity ion such as boron is implanted into the region 125 below the isolation electrode 32 in the case where a p-type single crystal silicon substrate is used as the semiconductor substrate 1. Alternatively, an n-type impurity ion such as phosphorus is implanted into the region 126 below the gate electrode 31.

According to the semiconductor device of the present embodiment, the effect similar to that of the semiconductor device according to the first embodiment can be obtained by implanting the first impurity ion which has the same conductivity type as that of the impurity element included in the semiconductor substrate 1 into the region 125 below the isolation electrode 32.

By implanting the impurity ion which has the same conductivity type as that of the impurity element included in the semiconductor substrate 1 into the region 125 below the isolation electrode 32, the similar effect can be obtained as the case where the insulating film 25 with the increased thickness is formed below the isolation electrode 32. By implanting the impurity ion into the region 125 below the isolation electrode 32, the structure in which a channel region is not formed below the isolation electrode 32 can be accomplished. Thereby, the threshold voltage of the isolation electrode 32 can be made greater than in the related art.

Alternatively, the similar effect can be obtained by implanting the second impurity ion which has the different conductivity type from that of the impurity element included in the semiconductor substrate into the region 126 below the gate electrode 31. FIG. 29 is a fragmentary cross-sectional elevation view illustrating the semiconductor device including a memory cell in accordance with the third preferred embodiment of the present invention. In FIG. 29, the same parts as those in the first embodiment are denoted by the same reference numerals.

In a semiconductor device 310, an impurity diffusion region 126 is formed below the gate electrode 31. The impurity diffusion region 126 includes an impurity ion having a different conductivity type from the impurity ion included in the semiconductor substrate 1. A concentration of the impurity ion included in the impurity diffusion region 126 is higher than that of the impurity ion included in the semiconductor substrate 1. The bottom of the impurity diffusion region 126 is higher in level than the bottom of the insulating film 25. The impurity diffusion regions 126 are connected with each other via the impurity diffusion region 62 which is disposed between impurity diffusion regions 126.

The impurity diffusion region 126 is formed by introducing the impurity ion below the gate trench 31A after forming the gate trench 31A. After forming the impurity diffusion region 126, the gate insulating film 26 is formed. The processes after forming the gate insulating film 26 are the same as those in the first embodiment.

Similar to the first embodiment, the semiconductor device in which the junction field is eased by applying the same bias voltage to the isolation electrode 32 as the gate electrode 31 can be formed by adding the processes for forming the first isolation trench 32A and forming the insulating film 25. The semiconductor device in which the junction leakage current can be reduced can be formed. The semiconductor device in which the decrease of the electron density in the vicinity of the isolation electrode 32 can be suppressed can be formed. The semiconductor device in which the decrease of the on-current of the transistor can be prevented can be formed.

By implanting the n-type impurity ion such as phosphorus into the semiconductor substrate 1 formed of the p-type single crystal silicon below the gate electrode 31, the threshold voltage of the gate electrode 31 is reduced.

As described above, the impurity diffusion regions 126 are connected with each other via the impurity diffusion region 62 which is disposed between impurity diffusion regions 126 and is connected to the bit line 51. In other words, the impurity diffusion region 62 extends to parts of the semiconductor substrate 1 below the gate electrodes 31. According to this configuration, channel regions are formed on only parts of the side surfaces of the gate trenches 31A, each of which is an opposite side to the isolation electrode 32. Therefore, the channel resistance is reduced and the on-current is increased.

With miniaturization of the elements (transistors), a distance between adjacent transistors has been short and channel regions have been close to each other. Therefore, when the impurity diffusion region 126 is not formed below the gate trench 31A, a mutual interference of transistor operations may occur. As a result, a disturb failure in which the transistors cannot operate individually may occur. However, according to the present embodiment, the channel regions of the adjacent transistors are formed on only far sides of the surfaces of the gate trenches 31A. Therefore, the disturb failure can be avoided.

Fourth Embodiment

According to the present embodiment, a semiconductor device may employ the isolation electrode in the DRAM 10 provided with the buried gate transistor and a fin-shaped buried gate electrode as the gate electrode 31. The fin-type buried gate electrode is buried at the bottom.

Figure 30:
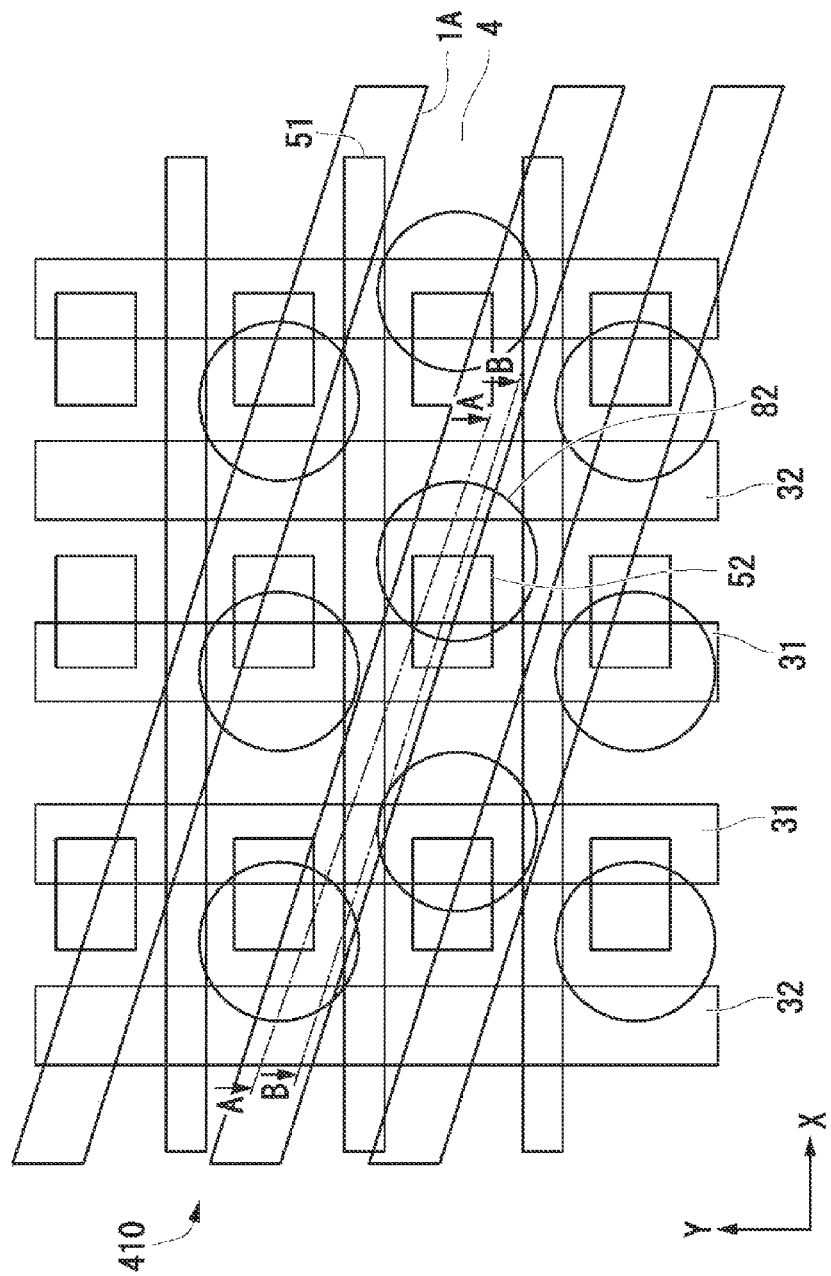
FIG. 30 is a fragmentary plan view illustrating a semiconductor device including a memory cell in accordance with the fourth preferred embodiment of the present invention.
Figure 31A:
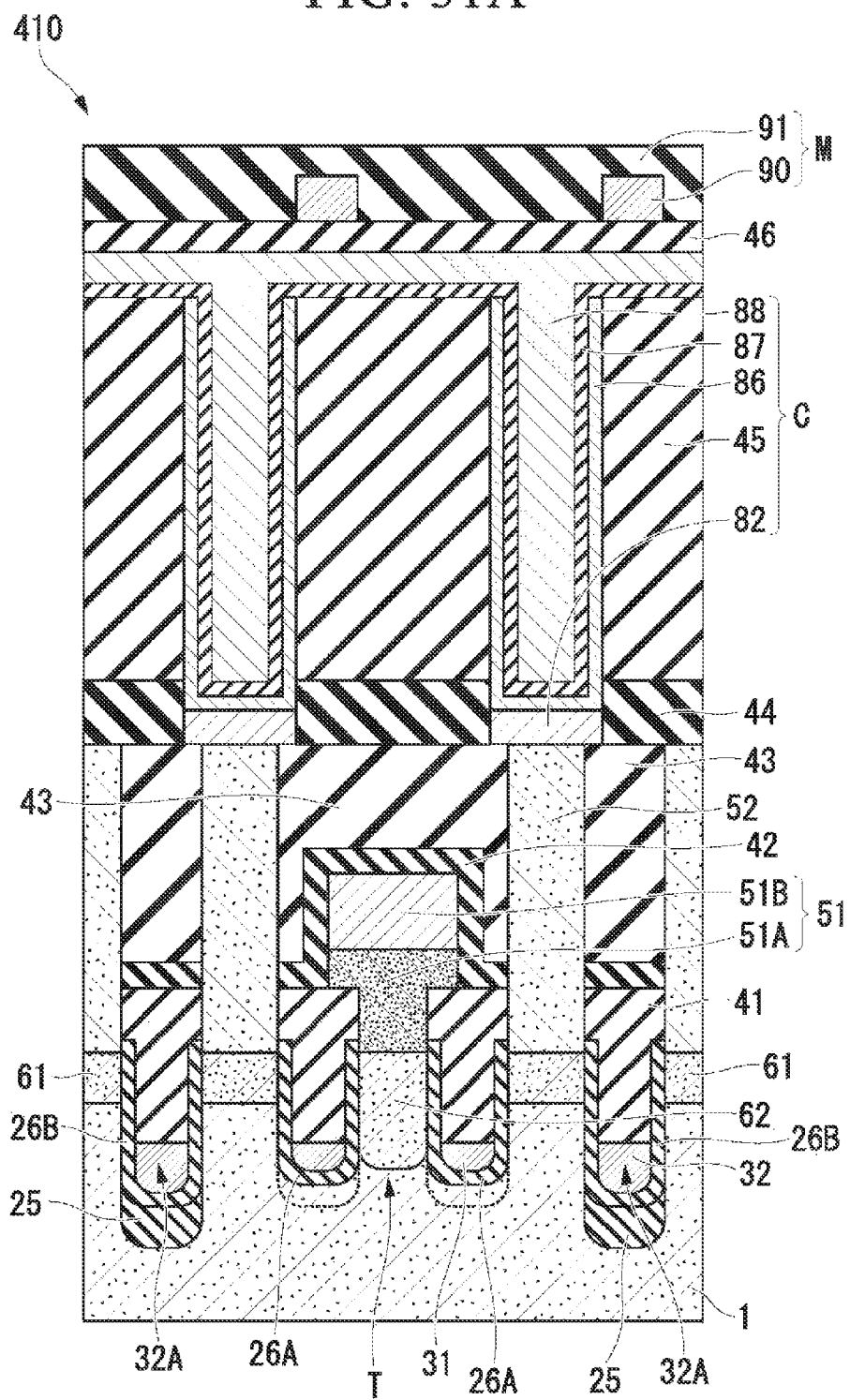
FIG. 31A is a fragmentary cross-sectional elevation view, taken along an A-A' line in FIG. 30, illustrating the semiconductor device including a memory cell in accordance with the fourth preferred embodiment of the present invention.
Figure 31B:
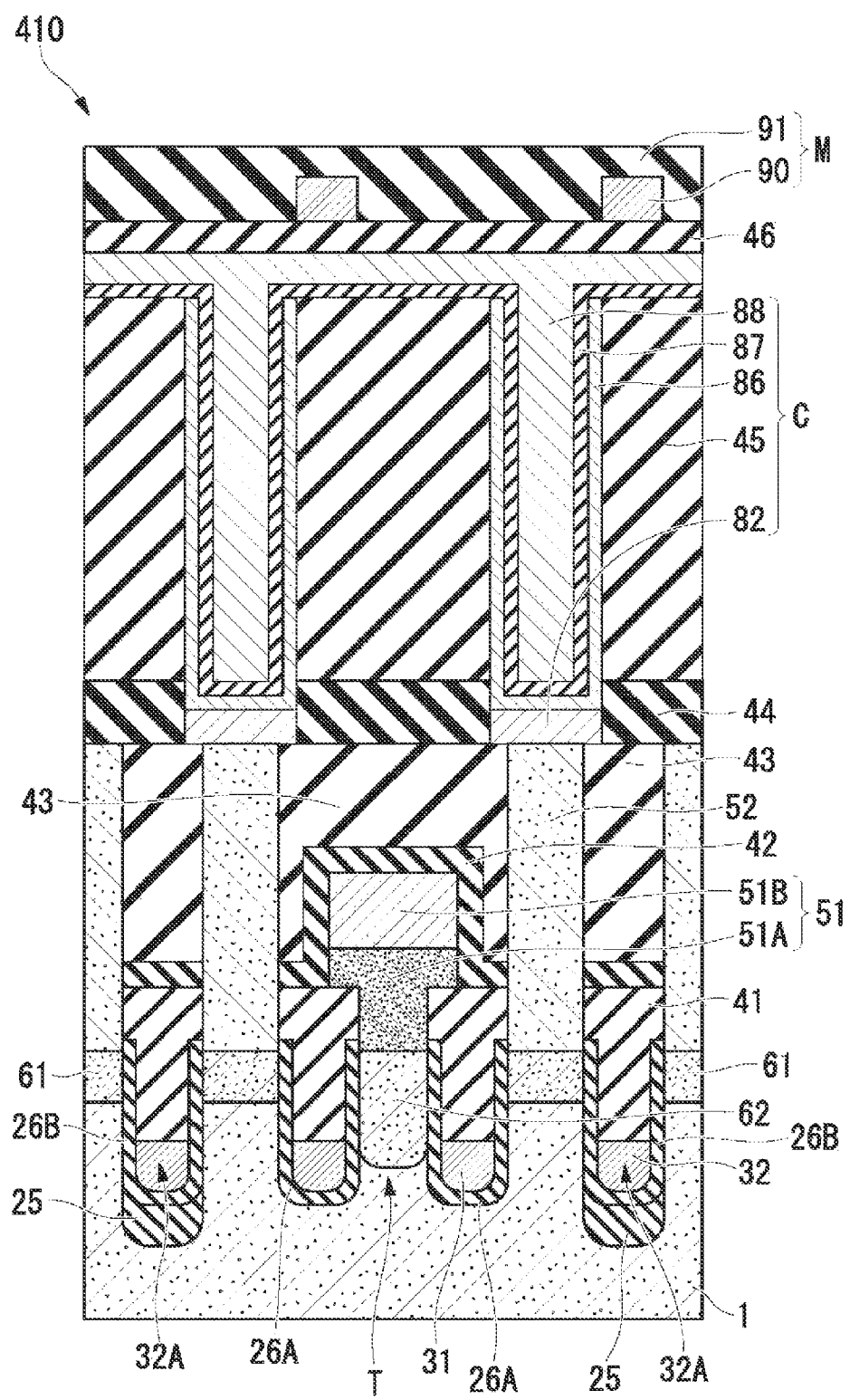
FIG. 31B is a fragmentary cross-sectional elevation view, taken along a B-B' line in FIG. 30, illustrating the semiconductor device including a memory cell in accordance with the fourth preferred embodiment of the present invention.
Figure 31C:
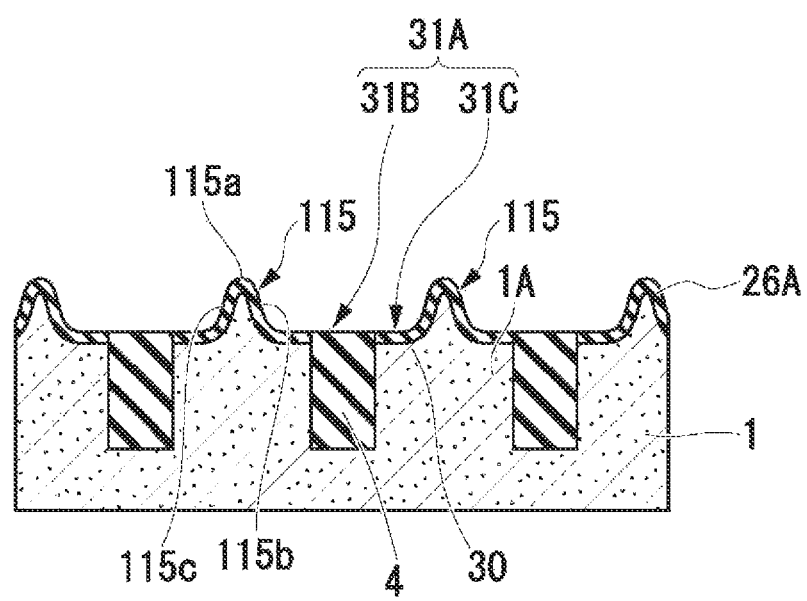
FIG. 31C is a fragmentary cross-sectional elevation view illustrating the semiconductor device including a memory cell in accordance with the fourth preferred embodiment of the present invention.

FIG. 30 is a fragmentary plan view illustrating a semiconductor device including a memory cell in accordance with the fourth preferred embodiment of the present invention. FIG. 31A is a fragmentary cross-sectional elevation view, taken along an A-A' line in FIG. 30, illustrating the semiconductor device including a memory cell in accordance with the fourth preferred embodiment of the present invention. FIG. 31B is a fragmentary cross-sectional elevation view, taken along a B-B' line in FIG. 30, illustrating the semiconductor device including a memory cell in accordance with the fourth preferred embodiment of the present invention. FIG. 31C is a fragmentary cross-sectional elevation view illustrating the semiconductor device including a memory cell in accordance with the fourth preferred embodiment of the present invention.

As shown in FIGS. 30 through 31C, a semiconductor device 410 may include, but is not limited to, a fin 115 protruding from a bottom of the gate trench 31A. The fin 115 is part of the active region 1A. The gate trench 31A crosses the isolation region 4 and the active region 1A. The gate trench 31A includes a first trench 31C in the active region 1A and a second trench 31B in the isolation region 4.

As shown in FIGS. 30 through 31C, a bottom of the first trench 31C in the active region 1A is the same level as the bottom of part of the second trench 31B in contact with the first trench 31C. In the center part of the first trench 31C, the fin 115 protrudes from the bottom of the first trench 31C.

As shown in FIGS. 30 through 31C, the fin 115 includes a top portion 115a, a first side surface 115b, and a second side surface 115c.

The top portion 115a extends in an extending direction of the active region 1A. The first and second side surfaces 115b and 115c are disposed in parallel to the extending direction of the active region 1A. As shown in FIG. 31C, an edge of the top portion 115a may be sharp or rounded.

By applying the fin-type buried gate electrode as the gate electrode, the channel region is formed in a fin formed at the bottom of the gate trench. Thereby, the effect similar to that in the first embodiment can be obtained.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device which includes hardware and/or software that is constructed and/or programmed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a semiconductor substrate having first and second grooves;
   a isolation electrode in the first groove;
   a gate electrode in the second groove;
   a gate insulating film between the semiconductor substrate and the gate electrode; and
   a first insulating film extending at least beneath the isolation electrode, the first insulating film beneath the isolation electrode being thicker than the gate insulating film beneath the gate electrode,
   wherein the isolation electrode extends in a line-shape in an isolation trench, and
   wherein the gate electrode extends as a word line disposed between adjacent line-shaped isolation electrodes.

2. The semiconductor device according to claim 1, wherein the gate electrode comprises titanium nitride.

3. The semiconductor device according to claim 1, wherein the gate electrode comprises tungsten.

4. The semiconductor device according to claim 1, further comprising a gate trench between adjacent isolation trenches, and a fin protruding from a bottom of the gate trench.

5. The semiconductor device according to claim 1, wherein a bottom of the isolation electrode is at the same level as a bottom of the gate electrode.

6. The semiconductor device according to claim 1, wherein the semiconductor substrate includes a first portion underneath the first groove and a second portion underneath the second groove, the first portion is higher in impurity concentration than the second portion.

7. The semiconductor device according to claim 1, further comprising a first diffusion region underneath the first groove, the first diffusion region having the same conductivity type as the semiconductor substrate, the first diffusion region being greater in impurity concentration than a different portion of the semiconductor substrate.

8. The semiconductor device according to claim 7, further comprising a second diffusion region underneath the second groove, the second diffusion region having the same conductivity type as the semiconductor substrate, the second diffusion region being lower in impurity concentration than a different portion of the semiconductor substrate.

9. The semiconductor device according to claim 1, wherein a bottom portion of the first insulating film is lower in level than a bottom portion of the gate insulating film.

10. The semiconductor device according to claim 9, wherein:
    the first insulating film further comprises side portions different from the bottom portion;
    the bottom portion of the first insulating film is positioned underneath a bottom of the isolation electrode;
    the side portions are positioned adjacent to side surfaces of the isolation electrode; and
    the bottom portion of the first insulating film is thicker than the side portions of the first insulating film.

11. The semiconductor device according to claim 10, wherein the bottom portion of the first insulating layer has a multi-layered structure.

12. A semiconductor device comprising:
    a semiconductor substrate having first and second grooves, the semiconductor substrate comprising a first portion underneath the first groove and a second portion underneath the second groove, the first portion being higher in impurity concentration than the second portion;
    an isolation electrode in the first groove;
    a gate electrode in the second groove;
    a gate insulating film adjacent to the gate electrode; and
    a first insulating film adjacent to the isolation electrode,
    wherein the gate insulating film and the first insulating film have a similar thickness.

* * * * *